United States Patent
Hosokawa et al.

(10) Patent No.: US 8,032,094 B2
(45) Date of Patent: Oct. 4, 2011

(54) DISCRETE FILTER, SAMPLING MIXER, AND RADIO DEVICE

(75) Inventors: Yoshifumi Hosokawa, Osaka (JP); Katsuaki Abe, Osaka (JP); Kentaro Miyano, Osaka (JP)

(73) Assignee: Panasonic Corporation, Osaka (JP)

( * ) Notice: Subject to any disclaimer, the term of this patent is extended or adjusted under 35 U.S.C. 154(b) by 463 days.

(21) Appl. No.: 12/303,936

(22) PCT Filed: Jun. 8, 2007

(86) PCT No.: PCT/JP2007/061671
§ 371 (c)(1),
(2), (4) Date: Dec. 8, 2008

(87) PCT Pub. No.: WO2007/142341
PCT Pub. Date: Dec. 13, 2007

(65) Prior Publication Data
US 2010/0167669 A1    Jul. 1, 2010

(30) Foreign Application Priority Data
Jun. 8, 2006    (JP) .................................. 2006-160280

(51) Int. Cl.
*H01Q 11/12* (2006.01)
*H03B 1/00* (2006.01)
(52) U.S. Cl. .................. 455/118; 327/552; 327/553
(58) Field of Classification Search .................. None
See application file for complete search history.

(56) References Cited

U.S. PATENT DOCUMENTS

| 7,589,585 | B2* | 9/2009 | Murata et al. ................. 327/551 |
| 7,623,838 | B2* | 11/2009 | Staszewski et al. ........... 455/319 |
| 7,791,407 | B2* | 9/2010 | Muhammad et al. ......... 327/552 |
| 2003/0080888 | A1 | 5/2003 | Muhammad et al. |
| 2006/0071707 | A1* | 4/2006 | Belveze et al. ................ 327/554 |
| 2006/0135107 | A1* | 6/2006 | Staszewski et al. ........... 455/307 |
| 2008/0240316 | A1* | 10/2008 | Yokoshima et al. .......... 375/350 |
| 2009/0021296 | A1* | 1/2009 | Miyano et al. ................ 327/553 |
| 2009/0196384 | A1* | 8/2009 | Staszewski et al. ........... 375/346 |
| 2009/0270061 | A1* | 10/2009 | Hosokawa et al. ............ 455/323 |
| 2010/0109746 | A1* | 5/2010 | Hosokawa et al. ............ 327/355 |
| 2010/0311375 | A1* | 12/2010 | Hosokawa et al. ............ 455/227 |
| 2010/0316174 | A1* | 12/2010 | Lee et al. ...................... 375/345 |

FOREIGN PATENT DOCUMENTS

| JP | 56-071324 | 6/1981 |
| JP | 2004-289793 | 10/2004 |

OTHER PUBLICATIONS

International Search Report dated Sep. 25, 2007.

* cited by examiner

*Primary Examiner* — Tuan T Lam
(74) *Attorney, Agent, or Firm* — Dickinson Wright PLLC

(57) ABSTRACT

Provided is a discrete filter capable of adjusting the number of notches and the notch frequency and easily eliminating a particular frequency component. In a sampling mixer (100), a control signal generation unit (104) generates a plurality of control signals having the same frequency and different phases. A convolution capacity unit (110) integrates the discrete signals obtained by sampling reception signals by using convolution capacitors at a timing based on the control signals. The signals integrated by the convolution capacitors are successively emitted at the timing based on a control signal other than the control signals used for the integration timing. Cb (15) integrates the emitted discrete signals. Thus, by adjusting the number of the convolution capacitors arranged in parallel to one another and the capacitance of each of the convolution capacitors, it is possible to realize a sampling mixer capable of adjusting the number of notches and the notch frequency and easily eliminating a particular frequency component.

16 Claims, 18 Drawing Sheets

DISCRETE FILTER, SAMPLING MIXER, AND RADIO DEVICE

TECHNICAL FIELD

The present invention relates to a discrete filter, sampling mixer and radio apparatus that carry out digital signal processing such as filtering.

BACKGROUND ART

In a conventional sampling mixer, a filter effect is obtained in a switched capacitor built in a sampling circuit by sampling a signal which is subjected to digital conversion in the sampling circuit (see, for example, Patent Document 1). The sampling mixer disclosed in Patent Document 1 will be described below with reference to the drawings.

FIG. 15 is a circuit diagram of sampling mixer 700 disclosed in Patent Document 1.

In FIG. 15, sampling mixer 700 has TA (transconductance amplifier) 1 that converts the received radio frequency (RF) signal into RF current $i_{RF}$, in-phase sampling mixer 2 that samples RF current $i_{RF}$ converted by TA 1, reverse phase sampling mixer 3 that is combined with in-phase sampling mixer 2 and DCU (digital control unit) 4 that generates control signals for in-phase sampling mixer 2 and reverse phase sampling mixer 3.

In-phase sampling mixer 2 has sampling switch 5 composed of the FET and Ch (history capacitor) 6 that continues integrating in the time domain the signal sampled by this sampling switch 5. Further, in-phase sampling mixer 2 has a plurality of Cr (rotate capacitor) 7, 8, 9, 10, 11, 12, 13 and 14 that repeat integration and release of the signal sampled in sampling switch 5 and Cb (buffer capacitor) 15 that buffers signals released from rotate capacitors 7 to 14.

Further, in-phase mixer 2 has dump switch 16 for releasing the signals held in Cr 7 to 14 to Cb 15, reset switch 17 that resets signals held in Cr 7 to 14 after signal release and a plurality of integration switches 18, 19, 20, 21, 22, 23, 24 and 25 for sequentially connecting Ch 6 with Cr 7 to 14. Furthermore, in-phase mixer 2 has a plurality of release switches 26, 27, 28, 29, 30, 31, 32 and 33 for sequentially connecting Cr 7 to 14 with Cb 15 and feedback switch 34 that controls an input of a feedback signal from a DA (digital-to-analogue) converter to sampling mixer 700.

Dump switch 16, reset switch 17, integration switches 18 to 25, release switches 26 to 33 and feedback switch 34 are each composed of the n-type FET. The n-type FET is turned on when the gate voltage shows the high level and is turned off when the gate voltage shows the low level. Further, reverse phase mixer 3 is composed in the same way as in-phase mixer 2.

DCU 4 is connected to the gates of integration switches 18 to 25, release switches 26 to 33, dump switch 16, reset switch 17 and feedback switch 34. DCU 4 outputs various control signals to the gates of these switches 16 to 34.

Types of control signals include the SV0 signal to SV7 signal, SAZ signal, SBZ signal, D signal, R signal and F signal. The SV0 signal to SV7 signal operate as the gate signals for applicable integration switches 18 to 25. The SAZ signal operates as the gate signal for release switches 30 to 33 and the SBZ signal operates as the gate signal for release switches 26 to 29.

The D signal operates as the gate signal for dump switch 16 and the R signal operates as the gate signal for reset switch 17. The F signal operates as the gate signal for feedback switch 34.

FIG. 16 shows a timing chart of the control signals generated in DCU 4.

As shown in FIG. 16, the LO signal is a periodic rectangular pulse, and, when the LO signal rises after a predetermined cycle, the SV0 signal to SV7 signal repeat rising and falling alternately.

Then, when the SV0 signal and the SV4 signal rise, the states of the SAZ signal and the SBZ signal are inverted.

The D signal rises when the SV0 signal and SV4 signal rise. On the other hand, the D signal falls when the SV1 signal and SV5 signal fall.

The R signal rises when the D signal falls. Further, the F signal rises when the R signal falls.

Next, referring to the timings of the above control signals, the operation of sampling mixer 700 will be described. The operation of in-phase mixer 2 will be described in detail as an example.

First, TA 1 converts the RE signal into RF current $i_{RF}$ and supplies this RF current $i_{RF}$ to in-phase sampling mixer 2. Then, in-phase mixer 2 samples supplied RF current $i_{RF}$ using the LO signal. The LO signal has virtually the same frequency as RF current $i_{RF}$. As a result, RF current $i_{RF}$ is discretized in the time domain, and produces discrete signals.

Then, the discrete signals are integrated in Ch 6 and Cr 7 to 14 and filtered and decimated (i.e. decimation). To be more specific, first, the SV0 signal is inputted to the gate of integration switch 18, integration switch 18 is turned on while the SV0 signal shows the high level and Ch 6 is connected to Cr 7. Then, discrete signals are held in Ch 6 and Cr 7. In this case, Cr 7 integrates the discrete signal while the SV0 signal shows the high level (for example, during the eight cycles of the LO signal).

Next, when the SV0 showing the high level falls, the SV1 signal rises at the same time. Then, integration switch 18 is turned off and integration switch 19 is turned on. As a result, Cr 7 is disconnected from Ch 6 and Cr 8 is connected to Ch 6. Then, Ch 6 and Cr 8 hold discrete signals, and Cr 8 integrates the discrete signal while the SV1 signal shows the high level (for example, during eight cycles of the LO signal).

When the SV2 signal to SV7 signal are sequentially inputted to the gates of integration switches 20 to 25, integration switches 20 to 25 are turned on while the SV2 signal to SV7 signal show the high level (for example, during eight cycles of the LO signal). Then, Cr 9 to 14 are sequentially connected to Ch 6, and Cr 9 to 14 integrate discrete signals during, for example, eight cycles of the LO signal.

By so doing, it is possible to produce an effect of an eight-tap FIR (Finite Impulse Response) filter. The sampling rate in this case is decimated to a one-eighth, because signals matching eight cycles of the LO signal are moved, held in eight integration switches 18 to 25 and averaged. A filter configured this way will be referred to as "first step FIR filter."

Further, Ch 6 sequentially connected with Cr 7 to 14 holds output potential, so that it is possible to produce an effect of an IIR (Infinite Impulse Response) filter. A filter configured this way will be referred to as "first step IIR filter."

Further, when the above-described SAZ signal is inputted to release switches 26 to 33, all release switches 26 to 33 are turned on while the SAZ signal shows the high level. Then, the discrete signals integrated in Cr 7 to 10 are released to Cb 15 at the same time through release switches 26 to 33 that are turned on.

After this release, next, the D signal shows the low level, dump switch 16 is turned off and Cb 15 is disconnected from Cr 7 to 10.

Next, the R signal shows the high level, reset switch 17 is turned on and signals held in Cr 7 to 10 are reset.

By so doing, signals integrated in Cr 7 to 10 are released to Cb 15 at the same time, so that it is possible to produce an effect of a four-tap FIR filter. The sampling rate in this case is decimated to a one-fourth, because signals integrated by four Cr 7 to 10 is moved and averaged by Cb 15.

Further, signals integrated by Cr 11 to 14 function similar to the case of Cr 7 to 10 and are released to Cb 15 at the same time while the SBZ signal shows the high level. Consequently, it is possible to produce an effect of a four-tap FIR filter. Further, the sampling rate is decimated to a one-fourth. A filter configured this way will be referred to as "second step filter."

Further, when the SAZ signal shows the high level and the SBZ signal shows the low level, if the R signal is inputted to the gate of reset switch 17 and reset switch 17 is turned on, signals held in four Cr 7 to 10 are released to the ground terminal end of Cr 7 to 10 and reset. On the other hand, when the SBZ signal shows the high level and the SAZ signal shows the low level, if the R signal is inputted to the gate of reset switch 17 and reset switch 17 is turned on, signals held in four Cr 11 to 14 are released to the ground terminal end of Cr 11 to 14 and are reset.

Then, when the F signal is inputted to the gate of feedback switch 34 and feedback switch 34 is turned on, a feedback signal is inputted to sampling mixer 700 from a signal processor through a DA converter (not shown). The feedback signal refers to a signal for compensating for the DC offset or differential offset, and is generated in the signal processor (not shown). To be more specific, the signal processor receives as input the output signal of sampling mixer 700 through the AD converter. Then, the signal processor generates the above-described feedback signal based on this output signal and inputs the feedback signal to sampling mixer 700 through the DA converter. By this means, the DC offset and differential offset are compensated for. By means of the feedback signal in this case, the DC offset and differential offset are compensated for upon the operation of the first step IIR filter.

Further, four Cr are connected to Cb 15 in the above-described unit of a group of four Cr 7 to 10 or a group of four Cr 11 to 14. By this means, it is possible to produce an effect of an IIR filter. A filter configured this way will be referred to as "second step IIR filter."

Further, reverse phase sampling mixer 3 operates in virtually the same way as in-phase sampling mixer 2 except the following.

That is, the LOB signal operating as the gate signal for sampling switch 35 of reverse phase sampling mixer 3 has 180 degrees of phase difference from the LO signal, and the sampling timing in reverse phase sampling mixer 3 is delayed by half of the cycle, from the timing in in-phase sampling mixer 2.

If sampling mixer 700 is configured this way, the output signal of sampling mixer 700 becomes a signal that has passed through the first step FIR filter, first step IIR filter, second step FIR filter and second step IIR filter.

Next, filter characteristics including the above-described various filters will be described with reference to FIG. 17. Assume that the LO signal frequency is 2.4 GHz, Ch 6 is 15 pF, Cr 7 to 14 are 0.5 pF, Cb 15 is 15 pF and the transconductance of TA 1 is 7.5 mS.

FIG. 17A shows characteristics of the first step FIR filter and FIG. 17B shows characteristics of the first step IIR filter. Further, FIG. 17C shows characteristics of the second step FIR filter, and FIG. 17D shows characteristics of the second step IIR filter. Then, FIG. 17E shows overall filter characteristics of sampling mixer 700. According to this FIG. 17E, the notches (zero points) of overall sampling mixer 700 are formed with the notches of the first step FIR filter (see FIG. 17A) and the notches of the second step IIR filter (see FIG. 17C).

In sampling mixer 700 configured this way, a signal that has passed through four filters, that is, through the first step FIR filter, first step IIP filter, second step FIR filter and second step IIR filter, is inputted to the AD converter.

Patent Document 1: Japanese Patent Application Laid-Open No. 2004-289793 (page 6 to 9, FIG. 3a, FIG. 3b and FIG. 4)

DISCLOSURE OF INVENTION

Problems to be Solved by the Invention

However, with the sampling mixer disclosed in Patent Document 1, the bandwidth of notches produced by the FIR filter narrows, and it is difficult to remove specific frequency components using notches.

Further, given that notches produced by the FIR filter are added by decimating the sampling rate, the number of notches and notch frequency are determined according to decimation.

In view of the above, it is therefore an object of the present invention to provide a discrete filter that is able to adjust the number of notches and notch frequency and remove specific frequency components at ease.

Means for Solving the Problem

The discrete filter according to the present invention includes a control signal generator that generates a plurality of control signals of a same frequency and varying phases; a convolution capacity section that receives as input a received signal; a buffer capacitor that integrates a discrete signal released from the convolution capacity section, and employs a configuration in which: the convolution capacity section includes m+1 integration units including m integration elements connected in parallel (where m is a natural number of two or more); all of the m integration elements included in one integration unit selected from the m+1 integration units integrate the received signal at a same timing based on the control signals; and an integration element selected one by one from the m integration units other than the selected one integration unit, outputs a signal integrated earlier at a same timing at which the received signal is integrated.

Advantageous Effect of the Invention

According to the present invention, by convoluting a discrete signal, the order of an input is increased in the IIR filter composed of a convolution capacity section and buffer capacitor. Consequently, a filter with notches is configured, so that it is possible to adjust the number of notches and notch frequency and remove specific frequency components at ease.

BEST MODE FOR CARRYING OUT THE INVENTION

Figure 1:
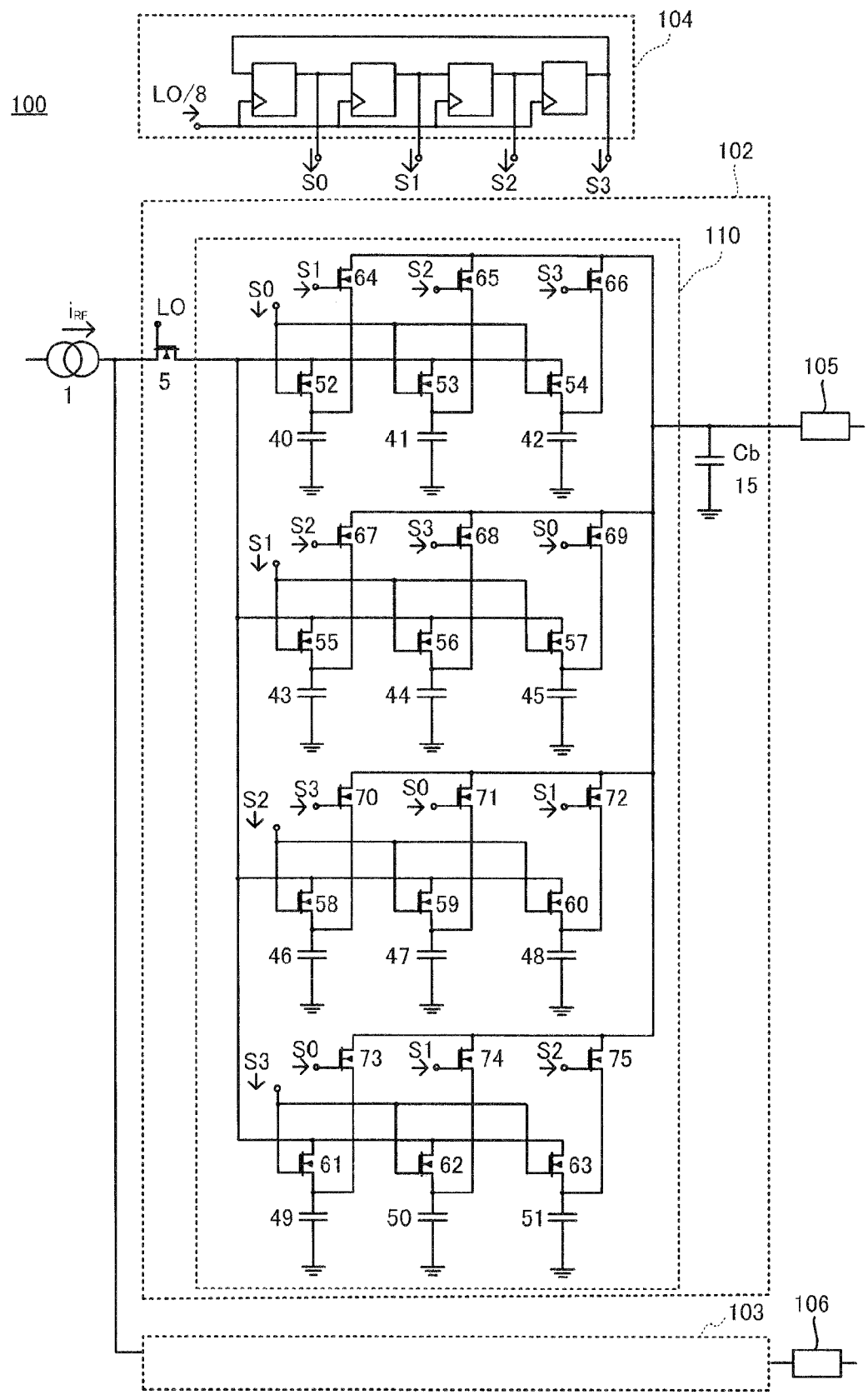
FIG. 1 shows an example of a circuit of a sampling mixer according to Embodiment 1 of the present invention.

Embodiments 1 to 6 according to the present invention will be described with reference to the drawings Further, the embodiments will be described by assigning the same reference numerals (term) to the same parts.

Embodiment 1

FIG. 1 shows an example of a circuit of a sampling mixer according to Embodiment 1 of the present invention. In FIG. 1, sampling mixer 100 has: TA (transconductance amplifier) 1; in-phase sampling mixer (hereinafter "in-phase mixer") 102 and reverse phase sampling mixer (hereinafter "reverse phase mixer") 103 that are connected in parallel with TA 1; and control signal generator (signal generator) 104 that generates a control signal to in-phase mixer 102 and reverse phase mixer 103.

TA 1 converts a received radio frequency (RF) signal into RF current $i_{RF}$ and supplies RF current $i_{RF}$ to in-phase mixer 102 and reverse phase mixer 103.

In-phase mixer 102 has sampling switch 5, convolution capacity section (signal integrator) 110, and Cb (buffer capacitor, also referred to as "first capacitor") 15. Sampling switch 5 is composed of, for example, an n-type FET. Further, reverse phase mixer 103 is not shown and nevertheless is configured in the same way as in-phase mixer 102.

Convolution capacity section 110 has a plurality of convolution capacitors (integration elements) 40, 41, 42, 43, 44, 45, 46, 47, 48, 49, 50 and 51, a plurality of integration switches 52, 53, 54, 55, 56, 57, 58, 59, 60, 61, 62 and 63 and a plurality of release switches 64, 65, 66, 67, 68, 69, 70, 71, 72, 73, 74 and 75. These switches 52 to 75 are composed of, for example, an n-type FET.

To be more specific, drains of four integration switches 54, 57, 60 and 63 are connected in parallel to the drain of sampling switch 5.

Sources of four integration switches 54, 57, 60 and 63 are connected to ends of convolution capacitors 42, 45, 48 and 51. The other ends of convolution capacitors 42, 45, 48 and 51 are grounded.

Then, two integration switches 52 and 53 are connected in parallel between the drain of integration switch 54 and the drain of sampling switch 5. Sources of these integration switches 52 and 53 are connected with convolution capacitors 40 and 41. The other ends of convolution capacitors 40 and 41 are grounded.

Further, the source of release switch 64 is connected between the source of integration switch 52 and one end of convolution capacitor 40. Furthermore, the drain of release switch 65 is connected between the source of integration switch 53 and one end of convolution capacitor 41. Still further, the source of release switch 66 is connected between the source of integration switch 54 and one end of convolution capacitor 42.

The gates of above-described three integration switches 52, 53 and 54 are configured to receive as input the S0 signal from control signal generator 104. Further, the gate of release switch 64 is configured to receive as input the S1 signal from control signal generator 104. The gate of release switch 65 is configured to receive as input the S2 signal from control signal generator 104. The gate of release switch 66 is configured to receive as input the S3 signal from control signal generator 104.

Similarly, a set of circuits (hereinafter also referred to as "integration unit") including three integration switches 52, 53 and 54, three convolution capacitors 40, 41 and 42 and three release switches 64, 65 and 66, is configured on the drain end of sampling switch 5. With the present embodiment, for example, four sets of such circuits are formed and these four sets of circuits are connected in parallel. However, the number of these circuits may be changed.

The second set of circuits (integration unit) is configured to include three integration switches 55, 56 and 57, three convolution capacitors 43, 44 and 45 and three release switches 67, 68 and 69. In this case, the gates of three integration switches 55, 56 and 57 are configured to receive as input the S1 signal from control signal generator 104. Further, the gate of release switch 67 is configured to receive as input the S2 signal from control signal generator 104. The gate of release switch 68 is configured to receive as input the S3 signal from control signal generator 104. The gate of release switch 69 is configured to receive as input the S0 signal from control signal generator 104.

The third set of circuits (integration unit) is configured to include three integration switches 58, 59 and 60, three convolution capacitors 46, 47 and 48 and three release switches 70, 71 and 72. In this case, the gates of three integration switches 58, 59 and 60 are configured to receive as input the S2 signal from control signal generator 104. Further, the gate of release switch 70 is configured to receive as input the S3 signal from control signal generator 104. The gate of release switch 71 is configured to receive as input the S0 signal from control signal generator 104. The gate of release switch 72 is configured to receive as input the S1 signal from control signal generator 104.

The fourth set of circuits (integration unit) is configured to include three integration switches 61, 62 and 63, three convolution capacitors 49, 50 and 51 and three release switches 73, 74 and 75. In this case, the gates of three integration switches 61, 62 and 63 are configured to receive as input the S3 signal from control signal generator 104. Further, the gate of release switch 73 is configured to receive as input the S0 signal from control signal generator 104. The gate of release switch 74 is configured to receive as input the S1 signal from control signal generator 104. The gate of release switch 75 is configured to receive as input the S2 signal from control signal generator 104.

Control signal generator 104 is composed of, for example, a shift register formed with four registers. Further, control signal generator 104 generates a control signal such as the above-described SV0 signal based on a one-eighth of the LO signal (local oscillation signal).

Next, the configuration of convolution capacity section 110 will be described in detail. Convolution capacity section 110 has a plurality of convolution capacitors 40, 41, 42, 43, 44, 45, 46, 47, 48, 49, 50 and 51, a plurality of integration switches 52, 53, 54, 55, 56, 57, 58, 59, 60, 61, 62 and 63, and a plurality of release switches 64, 65, 66, 67, 68, 69, 70, 71, 72, 73, 74 and 75. These switches 52 to 75 are composed of, for example, an n-type FET.

Convolution capacitors 40 to 42 form the first capacitor group. Similarly, convolution capacitors 43 to 45 form the second capacitor group. Convolution capacitors 46 to 48 form the third capacitor group. Convolution capacitors 49 to 51 form the fourth capacitor group. Convolution capacity section 110 is composed of a plurality of capacitor groups.

That is, convolution capacity section 110 of sampling mixer 100 has: four integration units that each have three convolution capacitors connected in parallel, integration switches which switch inputted states of discrete signals to the three convolution capacitors obtained by sequentially sampling a received signal, and three release switches which are connected with the convolution capacitors and which are connected in parallel; and first capacitor 15 that integrates output signals of the integration units.

Figure 2:
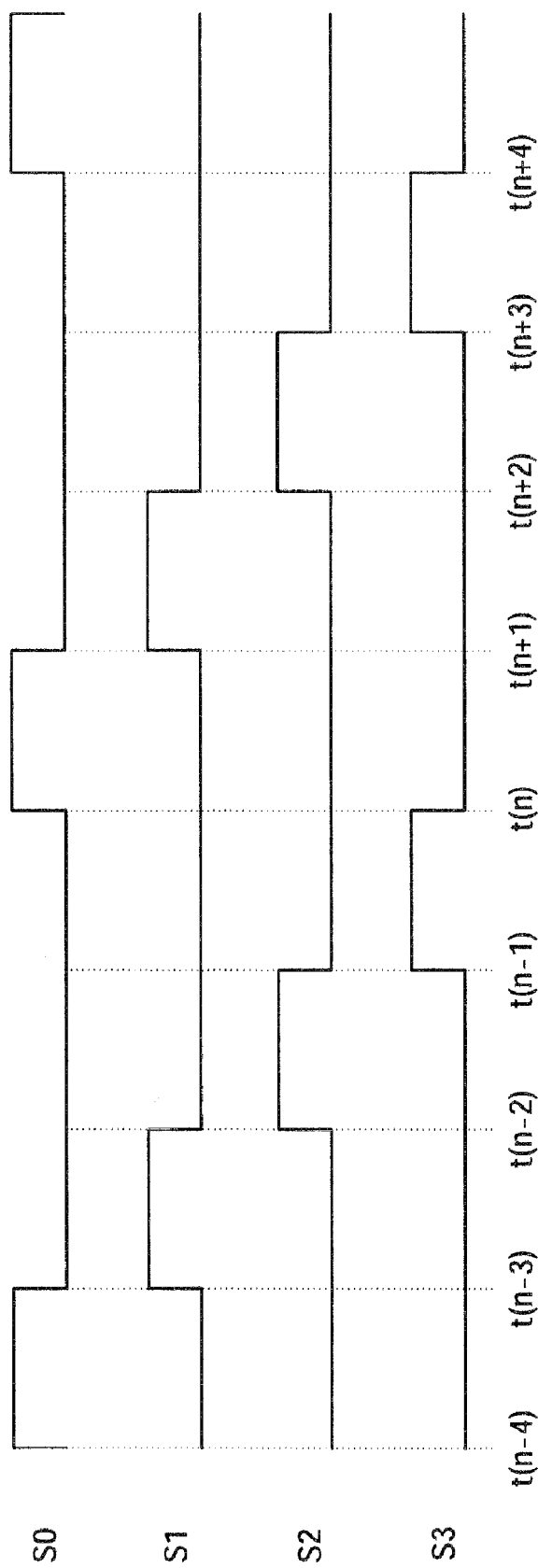
FIG. 2 is a timing chart of control signals generated in a control signal generator of FIG. 1.

FIG. 2 is a timing chart of control signals generated in control signal generator 104. According to FIG. 2, the S0 signal, S1 signal, S2 signal and S3 signal are each shifted by a one-fourth of a cycle to produce pulses. The period these signals show the high level matches the period of eight cycles of the LO signal. That is, the above plurality of control signals have the same frequency and varying phases. Further, the signals S0 to S3 are generated by the shift register of control signal generator 104. In this case, "LO/8 signal" (which is obtained by dividing the LO signal by eight) is used for the clock. Although the present embodiment will be described assuming that the period the signal S0 to S3 are high matches the eight cycles of the LO signal, the period is not limited to this and may be changed.

Next, referring to timings of the above-described control signals, the operation of sampling mixer 100 will be described. An example of in-phase mixer 102 will be described in detail. First, TA 1 converts the RF signal into RF current $i_{RF}$ and supplies this RF current $i_{RF}$ to in-phase mixer 102. Then, in-phase mixer 102 samples RF current $i_{RF}$ using the LO signal. The Lo signal has virtually the same frequency as RF current $i_{RF}$. When RF current $i_{RF}$ is sampled in this way, RF current $i_{RF}$ is discretized in the time domain, and produces discrete signals.

Then, when the S0 signal rises, integration switches 52 to 54 are turned on while the S0 signal shows the high level (see, for example, t(n) to t(n+1) of FIG. 2). Then, the above-described discrete signals move to convolution capacitors 40 to 42 (first capacitor group) through integration switches 52 to 54 that are turned on. As a result, the discrete signals are integrated in convolution capacitors 40 to 42 (first capacitor group).

Next, when the S0 signal falls and the S1 signal rises, integration switches 52 to 54 are turned off. On the other hand, integration switches 55 to 57 are turned on while the S1 signal shows the high level (see, for example, t(n+1) to t(n+2)). Then, the above-described discrete signals move to convolution capacitors 43 to 45 (second capacitor group) through integration switches 55 to 57 that are turned on. As a result, the discrete signals are integrated in convolution capacitors 43 to (second capacitor group).

Next, when the S1 signal falls and the S2 signal rises, integration switches 55 to 57 are turned off. On the other hand, integration switches 58 to 60 are turned on while the S2 signal shows the high level (see, for example, t(n+2) to t(n+3)). Then, the above-described discrete signals move to convolution capacitors 46 to 48 (third capacitor group) through integration switches 58 to 60 that are turned on. As a result, the discrete signals are integrated in convolution capacitors 46 to 48 (third capacitor group)

Next, when the S2 signal falls and the S3 signal rises, integration switches 58 to 60 are turned off. On the other hand, integration switches 61 to 63 are turned on while the S3 signal shows the high level (see, for example, t(n+3) to t(n+4)). Then, the above-described discrete signals move to convolution capacitors 49 to 51 (fourth capacitor group) through integration switches 61 to 63 that are turned on. As a result, the discrete signals are integrated in convolution capacitors 49 to (fourth capacitor group).

In this way, the discrete signals are sequentially integrated in three convolution capacitors according to the states of the levels of the S0 to S3 signals. That is, the discrete signal is integrated per capacitor group. Consequently, it is possible to produce an effect of an FIR filter. The sampling rate in this case is decimated to a one-eighth.

Further, when the S0 signal rises, release switches 69, 71 and 73 are turned on while the S0 signal shows the high level (see, for example, t(n) to t(n+1) of FIG. 2). Then, signals integrated in convolution capacitors 45, 47 and 49 connected to release switches 69, 71 and 73 are released to Cb 15 through release switches 69, 71 and 73 that are turned on.

In this case, the signal integrated in convolution capacitor 45 matches the signal integrated during the period of t(n−3) to t(n−2) of FIG. 2. Further, the signal integrated in convolution capacitor 47 matches the signal integrated during the period of t(n−2) to t(n−1) of FIG. 2. Furthermore, the signal integrated in convolution capacitor 49 matches the signal integrated during the period of t(n−1) to t(n) of FIG. 2. That is, portions of the discrete signals integrated in the second capacitor group, third capacitor group and fourth capacitor group, that is, portions of the discrete signals integrated in different periods, are integrated in Cb 15. As a result, Cb 15 holds signals which are each shifted by a one-fourth of the period and integrated, at the same time.

Further, when the S1 signal rises, release switches 64, 72 and 74 are turned on while the S1 signal shows the high level (see, for example, t(n+1) to t(n+2) of FIG. 2). Then, signals integrated in convolution capacitors 40, 48 and 50 connected to release switches 64, 72 and 74 are released to Cb 15 through release switches 64, 72 and 74 that are turned on.

In this case, the signal integrated in convolution capacitor 40 matches the signal integrated during the period of t(n) to t(n+1) of FIG. 2. Further, the signal integrated in convolution capacitor 48 matches the signal integrated during the period of t(n−2) to t(n−1) of FIG. 2. Furthermore, the signal integrated in convolution capacitor 50 matches the signal integrated during the period of t(n−1) to t(n) of FIG. 2. That is, portions of the discrete signals integrated in the first capacitor group, third capacitor group and fourth capacitor group, that is, portions of the discrete signals integrated in different periods, are integrated in Cb 15. In this case, Cb 15 also holds signals which are each shifted by a one-fourth of the period and integrated, at the same time.

Further, similar to the case where the S0 signal and the S1 signal show the high level, even when the S2 signal and the S3 signal rise, Cb 15 holds at the same time the signals which are each shifted by a one-fourth of the period and integrated.

That is, when the S2 signal rises, release switches 65, 67 and 75 are turned on while the S2 signal shows the high level (see, for example, t(n+2) to t(n+3)). Then, signals integrated in convolution capacitors 41, 43 and 51 connected to release switches 65, 67 and 75 are released to Cb 15 at the same time through release switches 65, 67 and 75 that are turned on.

In this case, the signal integrated in convolution capacitor 41 matches the signal integrated during the period of t(n) to t(n+1) of FIG. 2. Further, the signal integrated in convolution capacitor 43 matches the signal integrated during the period of t(n+1) to t(n+2) of FIG. 2. Furthermore, the signal integrated in convolution capacitor 50 matches the signal integrated during the period of t(n-1) to t(n) of FIG. 2. That is, portions of the discrete signals integrated in the first capacitor group, second capacitor group and fourth capacitor group, that is, portions of the discrete signals integrated in different periods, are integrated in Cb 15. In this case, Cb 15 also holds signals which are each shifted by a one-fourth of the period and integrated, at the same time.

Further, when the S3 signal rises, release switches 66, 68 and 70 are turned on while the S3 signal shows the high level (see, for example, t(n+3) to t(n+4) of FIG. 2). Then, signals integrated in convolution capacitors 42, 44 and 46 connected to release switches 66, 68 and 70 are released to Cb 15 at the same time through release switches 66, 68 and 70 that are turned on.

In this case, the signal integrated in convolution capacitor 42 matches the signal integrated during the period of t(n) to t(n+1) of FIG. 2. Further, the signal integrated in convolution capacitor 44 matches the signal integrated during the period of t(n+1) to t(n+2) of FIG. 2. Furthermore, the signal integrated in convolution capacitor 46 matches the signal integrated during the period of t(n+2) to t(n+3) of FIG. 2. That is, portions of the discrete signals integrated in the first capacitor group, second capacitor group and third capacitor group, that is, portions of the discrete signals integrated in different periods, are integrated in Cb 15. In this case, Cb 15 holds signals which are each shifted by a one-fourth of the period and integrated, at the same time.

As described above, integration switches in integration units are turned on in the same cycle such that the on states of integration units do not overlap in the time domain. A plurality of integration switches included in each integration unit are turned on and off at the same time. Further, the three release switches in each integration unit are turned on in the same cycle such that the on states of three release switches and the on states of integration switches provided in the same integration unit do not overlap in the time domain.

Further, convolution capacity section 110 carries out integration in three integration elements provided in the integration unit at timings based on a plurality of control signals S0 to S3. The control signal used for the integration timing varies between integrations units. Consequently, integration timings in integration units are shifted in the time domain. Then, signals integrated at integration timings in three integration elements are sequentially released at timings based on control signals other than the control signals used for the integration timings.

In this way, given that, when the S0 to S3 signals alternately show the high level, three integration switches and three release switches are turned on at the same time, signals integrated at three timings in the past are released to Cb 15 at the same time and held. Further, given that integration and release are carried out based on a plurality of control signals S0 to S3, the signal outputted from convolution capacity section 110 has the same sampling frequency as the sampling frequency determined by the timing at which integration is carried out based on the above control signal.

Specific examples will be described. For example, at t(n) of FIG. 2, before signals integrated in convolution capacitors 45, 47 and 49 are released to Cb 15, signals (signals released from convolution capacitors 42, 44 and 46) released at t(n−1) are held in Cb 15 as output signals of convolution capacity section 110.

Consequently, at t(n) of FIG. 2, in cases where signals integrated in convolution capacitors 45, 47, and 49 are released to Cb 15, Cb 15 holds signals integrated at t(n) in convolution capacitors 45, 47, and 49 and signals held at t(n−1) in Cb 15.

That is, at t(n) of FIG. 2, when the signals are released from convolution capacitors 45, 47 and 49 are released, the signals held at t(n−1) in Cb 15 are fed back. As a result, it is possible to produce an effect of the IIR filter.

Next, the transfer function of this IIR filter will be described. Assume that the discrete signal outputted from sampling switch 5 is q(t), the voltage of the convolution capacitor after the discrete signal is inputted is x(t) and the voltage of Cb 15 is y(t). Further, assume that the capacities of convolution capacitors 40, 43, 46 and 49 are C1, the capacities of convolution capacitors 41, 44, 47 and 50 are C2, the capacities of convolution capacitors 42, 45, 48 and 51 are C3 and the capacity of Cb 15 is Cb.

In this case, at t(n) of FIG. 2, discrete signals q(n) integrated in convolution capacitors 40 to 42 are represented by the following equation.

(Equation 1)

$$C1 \cdot y(n-3) + C2 \cdot y(n-2) + C3 \cdot y(n-1) + q(n) = (C1+C2+C3) \cdot x(n) \quad [1]$$

Further, the signal held in Cb 15 at t(n) of FIG. 2 is represented by the following equation.

(Equation 2)

$$C1 \cdot x(n-2) + C2 \cdot x(n-1) + C3 \cdot x(n) + Cb \cdot y(n-1) = (C1+C2+C3+Cb) \cdot y(n) \quad [2]$$

Further, transfer function H of the IIR filter after the Z transform from equation 1 and equation 2, can be represented by the following equation.

(Equation 3)

$$H = \frac{C1 + C2 \cdot z^{-1} + C3 \cdot z^{-2}}{(C1+C2+C3)(C1+C2+C3+Cb-Cb \cdot z^{-1}) - (C1 \cdot z^{-3} + C2 \cdot z^{-2} + C3 \cdot z^{-1})(C1 + C2 \cdot z^{-1} + C3 \cdot z^{-2})} \quad [3]$$

As is clear from equation 3, H has two zero points (see $z^{-1}$ and $z^{-2}$ in the numerator). Consequently, it is possible to produce deep notches in addition to the IIR filter characteristics represented by the denominator of equation 3. With the conventional sampling mixer, notches of the FIR filter and peaks of the IIR filter cancel each other. Therefore, notches appearing in overall filter characteristics of the conventional sampling mixer have a narrow frequency band and low capability for removing specific frequency components. By contrast with this, with the present embodiment, notches and peaks of the IIR filter do not cancel each other, so that it is possible to produce deep notches that have a wide frequency band and is able to remove specific frequency components in overall filter characteristics of the sampling mixer. Further, as is clear from equation 3, transfer function H of the IIR filter can be adjusted by changing the values of C1, C2 and C3.

Next, characteristics related to sampling mixer 100 will be described. Assume that the LO signal frequency is 2.4 GHz, the capacities of convolution capacitors 40 to 51 are all 0.5 pF, the capacity of Cb 15 is 15 pF, and the transconductance of TA 1 is 7.5 mS.

Figure 3A:
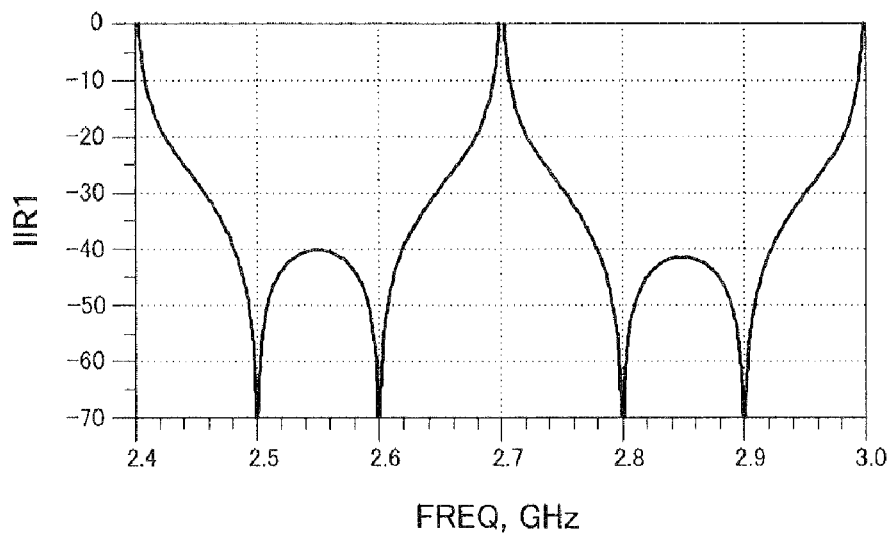
FIG. 3 shows frequency characteristics of the sampling mixer of FIG. 1.

FIG. 3A shows characteristics of the IIR filter. According to FIG. 3A, the IIR filter characteristics (the horizontal axis is the frequency and the vertical axis is gain) change at 300 MHz intervals, because the LO signal of 2.4 GHz is decimated to a one-eighth.

Further, in the band from 2.4 GHz to 2.7 GHz, two notches are produced near 2.5 GHz and 2.6 GHz.

Figure 3B:
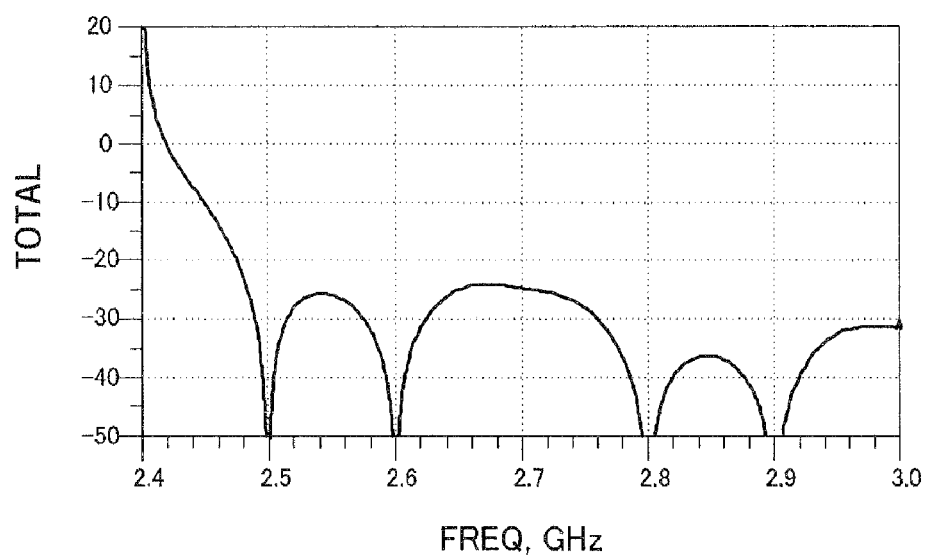
Figure 17A:
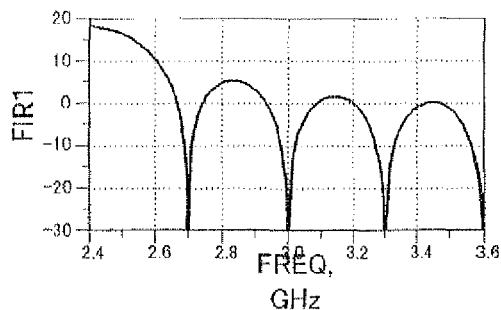
FIG. 17 shows frequency characteristics of the sampling mixer of FIG. 15.
Figure 17B:
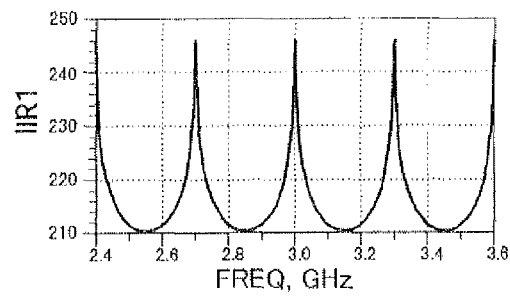
Figure 17C:
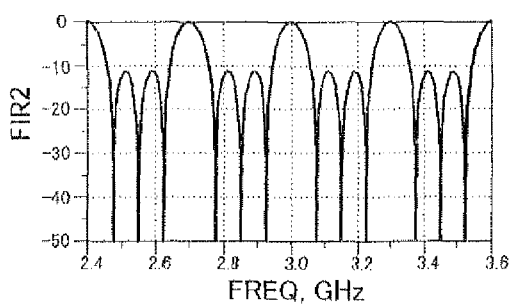
Figure 17D:
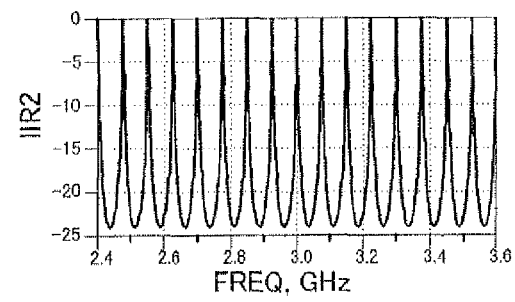
Figure 17E:
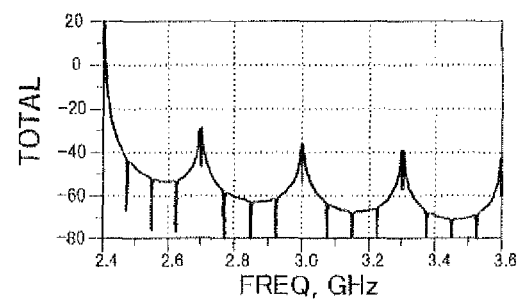

FIG. 3B shows overall characteristics of sampling mixer 100. Further, these characteristics are acquired by combining the characteristics of the IIR filter shown in FIG. 3A and the characteristics of the first step FIR filter shown in FIG. 17A.

According to FIG. 3B, near the desired wave of 2.4 GHz, the gain maximizes. Consequently, sampling mixer 100 is able to pass only a band used (desired wave).

Further, notches are produced near 2.5 GHz, 2.6 GHz, 2.8 GHz and 2.9 GHz. Consequently, signals having these frequencies are processed in sampling mixer 100 and are attenuated by these notches. As a result, reduction of power is realized.

As described above, according to sampling mixer 100 of the present embodiment, discrete signals integrated at specific timings are released at a plurality of different timings. Further, there are a plurality of timings at which discrete signals are integrated. Furthermore, in cases where integrated discrete signals are released to Cb 15 at respective release timings, a plurality of discrete signals integrated at different integration timings are included in signals accumulated in Cb 15.

Consequently, it is possible to provide notches with characteristics of an IIR filter composed of a plurality of convolution capacitors and Cb 15. The number of notches in this case is determined by the number of convolution capacitors that integrate discrete signals at the same time and the number of convolution capacitors that release signals to Cb 15 at the same time. With the present embodiment, the number of convolution capacitors that integrate discrete signals at the same time and the number of convolution capacitors that release signals to Cb 15 at the same time are three, so that two notches are produced by subtracting one from three. Further, the locations of frequencies at which notches appear are determined by the capacities of the convolution capacitors that integrate discrete signals at the same time.

Consequently, it is possible to adjust filter characteristics by adjusting the number and capacity values of convolution capacitors at random.

As described above, by removing an interfering wave of frequency components including notches, it is possible to suppress received sensitivity from deteriorating due to the distortion of output of the sampling mixer. Further, the interfering wave can be removed in this way, so that it is possible to reduce the parts of a filter.

Further, although various switches including sampling switch 5 are composed of an n-type FET with the present embodiment, the present invention is not limited to this. For example, various switches may be composed of a p-type FET or the combination of an n-type FET and the p-type FET. In this case, the source terminal and drain terminal may be switched. The micro elector mechanical system (MEMS) may also be applied.

Further, although sampling mixer 100 has been described, sampling mixer 100 may be applied as a discrete time processing filter. In this case, the discrete time processing filter is applied by removing sampling switch 5 from sampling mixer 100. Further, the BB (baseband) signal is used as an input signal to the discrete time processing filter. The BB signal is a received signal which is subjected to frequency conversion from the RF frequency band to the BB frequency band and may be a continuous signal or discrete signal.

Further, although discrete signals are integrated and released in group units (capacitor group) composed of three convolution capacitors, the number of convolution capacitors may be changed as long as the scope of the present invention does not deviate.

For example, in cases where the number of convolution capacitors forming the above-described group is m (where m is a natural number of two or greater), m convolution capacitors release signals integrated at t(n) of FIG. 2 to Cb 15 at timings of t(n+1), t(n+2), and t(n+m).

In this case, given that control signals from control signal generator 104 operate m convolution capacitors, (m+1) pulses obtained by shifting the phase each by 1/(m+1) of the period are required and m+1 groups of convolution capacitors that integrate signals at the same time are required. With such a configuration, it is possible to produce (m−1) notches.

Further, although the capacities of convolution capacitors are all 0.5 pF and the capacity of Cb 15 is 15 pF, these capacities are not limited to these. For example, convolution capacitors may have varying capacities. In this case, by changing the capacities of the convolution capacitors, it is possible to adjust the characteristics of the IIR filter to desired characteristics (see equation 3). By this means, it is possible to adjust overall characteristic (frequency-gain) of sampling mixer 100 to desired characteristics.

Further, although a case has been described where the LO signal frequency is 2.4 GHz, the LO signal frequency is not limited to this and may be changed.

As described above, according to the present embodiment, sampling mixer 100 has m+1 integration units composed of m (where m is two or greater) convolution capacitors each connected in parallel, and these m+1 integration units are each connected in parallel. The sampling mixer has: in the integration units, m integration switches that switch the inputted states of discrete signals to the m convolution capacitors generated by sequentially sampling the received signal in the sampling switch and m release switches that are connected with the convolution capacitors and that are connected in parallel; and first capacitor 15 that integrates output signals of the integration units.

Then, integration switches and release switches are turned on and off at the following timings. That is, the integration switches of the integration units are turned on in the same cycle such that the on states between the integration units do not overlap in the time domain. A plurality of integration switches included in the integration units are turned on and off at the same time. Further, m release switches in an integration unit are turned on in the same cycle such that the on states of m release switches and the on states of integration switches provided in the same integration unit do not overlap in the time domain. Further, m integration switches in the integration units are turned on and off at the same time and therefore may be one integration switch. By so doing, it is possible to provide an advantage of simplifying the configuration.

Then, sampling mixer 100 integrates discrete signals obtained by sampling a received signal in a plurality of convolution capacitors provided in different integration units at timings based on a plurality of control signals generated in control signal generator 104, and sequentially releases the signals integrated in a plurality of convolution capacitors at timings based on control signals other than control signals used as timings for integrating signals integrated in a plurality of convolution capacitors.

By so doing, by adjusting the number of convolution capacitors provided in parallel in integration units and the capacity values of the convolution capacitors, it is possible to realize a sampling mixer that is able to adjust the number of notches and notch frequency and remove specific frequency components at ease.

Embodiment 2

Figure 4:
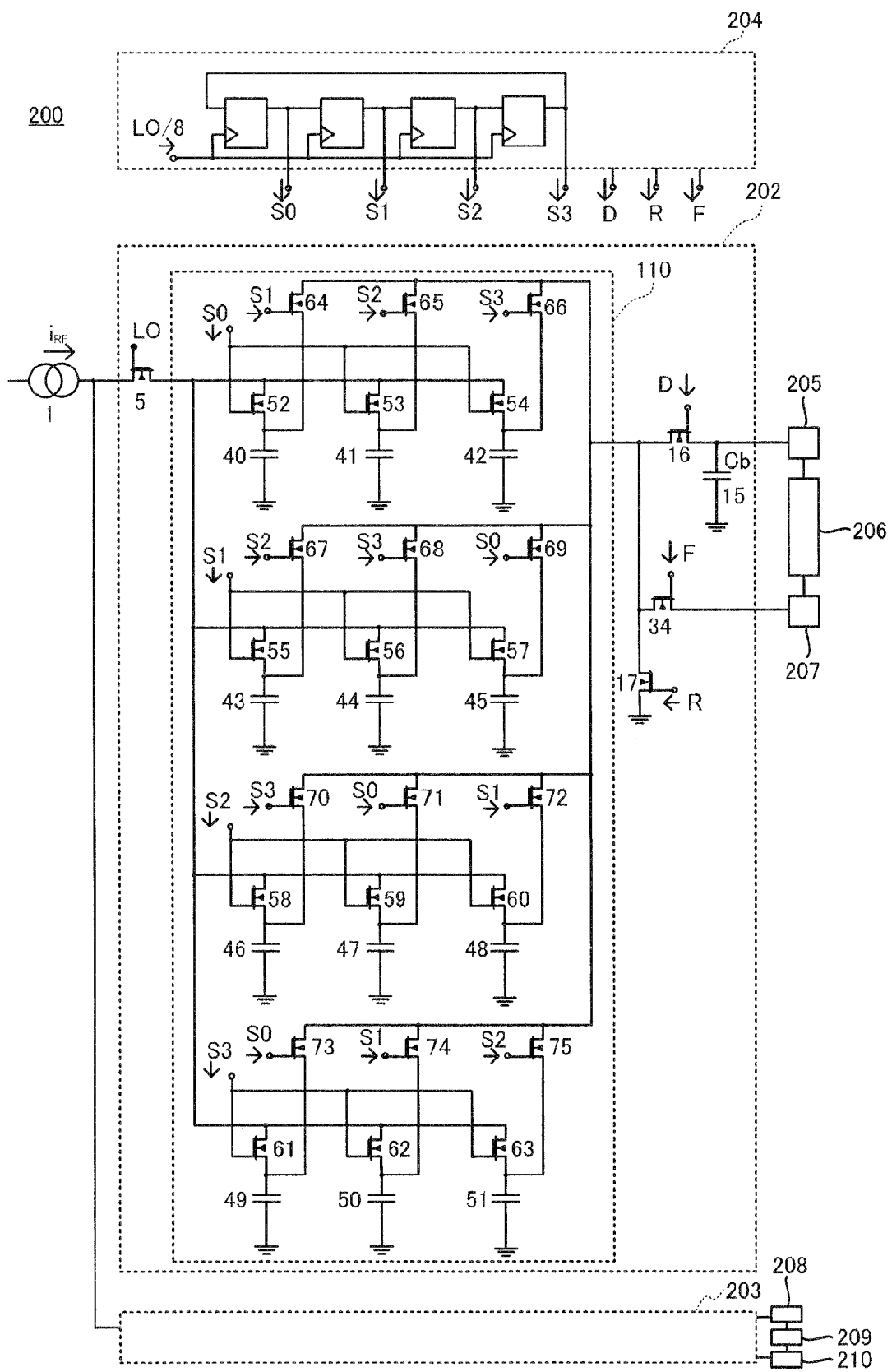
FIG. 4 shows an example of the circuit of the sampling mixer according to Embodiment 2 of the present invention.

FIG. 4 shows an example of a circuit of sampling mixer 200 according to Embodiment 2 of the present invention. Differences between the present embodiment and Embodiment 1 will be mainly described here.

Sampling mixer 200 is configured to include in-phase mixer 202, reverse phase mixer 203 and control signal generator 204 instead of in-phase mixer 102, reverse phase mixer 103 and control signal generator 104 in Embodiment 1 of FIG. 1.

In-phase mixer 202 is different from the case of Embodiment 1 and further has dump switch 16, reset switch 17 and feedback switch 34. These switches 16, 17 and 34 are composed of, for example, an n-type FET.

Control signal generator 204 further generates a D signal, R signal and F signal in addition to the S0 to S3 signals of Embodiment 1.

The D signal operates as the gates signal of dump switch 16. The R signal operates as the gate signal of reset switch 17 and the F signal operates as the gate signal of feedback switch 34.

Dump switch 16 is connected with DSP (digital signal processor) 206 through AD (analogue-to-digital) converter 205. AD converter 205 converts the output signal (analogue signals) of sampling mixer 200 in digital form. DSP 206 calculates a feedback signal for compensating for the DC offset and differential offset based on the output signal converted by AD converter 205.

For example, the DC offset is compensated for based on a comparison result between the reference value of DC and the above-described output signal. Further, the differential offset is compensated for based on calculation of average power based on the output signal.

Then, DSP 206 outputs the above-described feedback signal to convolution capacitors 40 to 51 through DA (digital-to-analogue) converter 207 and feedback switch 34. DA converter 207 converts the feedback signal in analogue form. The other configuration of sampling mixer 200 is virtually the same as in the case of Embodiment 1 and so repetition of description will not be described.

With such a configuration, the output signal of sampling mixer 200 is fed back to convolution capacitors 40 to 51, so that it is possible to compensate for the DC offset and the differential offset, which will be described later.

Further, reverse phase mixer 203 is configured in the same way as in-phase mixer 202. The output end of reverse phase mixer 203 is connected to AD converter 208 and DA converter 210. The configurations of AD converter 208 and DA converter 210 are the same as above-described AD converter 205 and DA converter 207.

Figure 5:
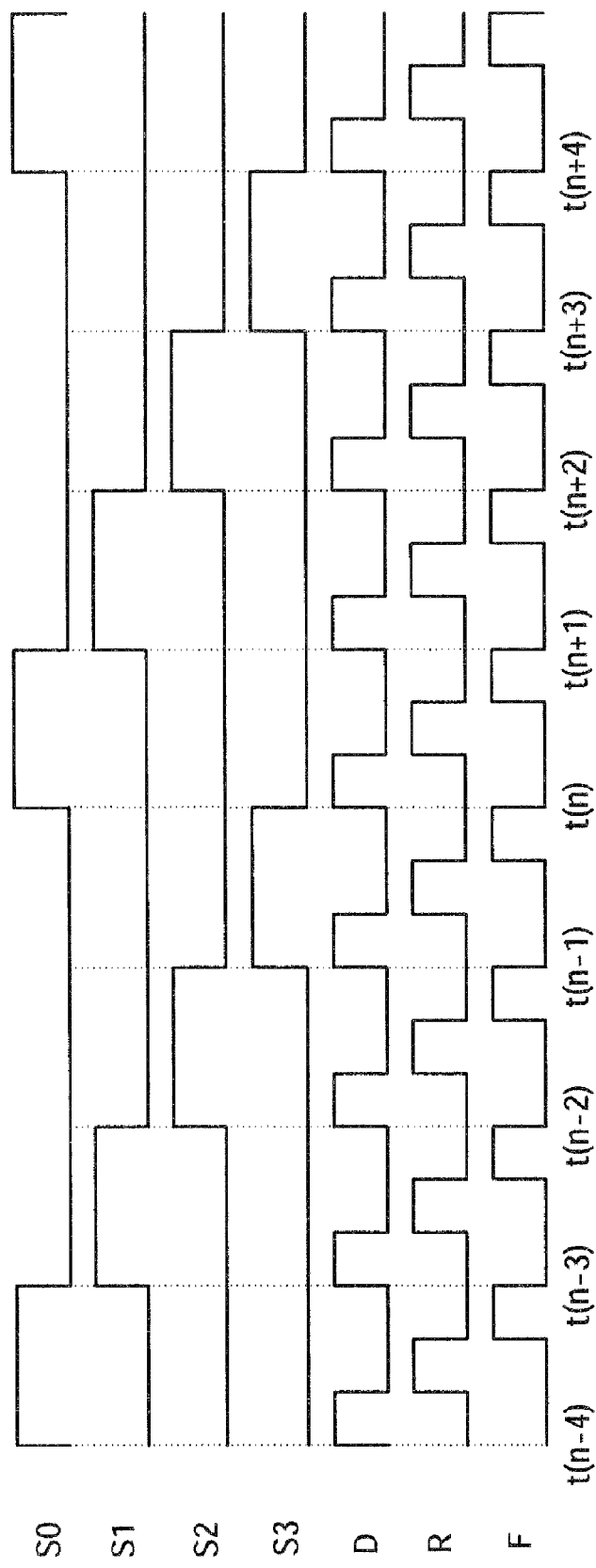
FIG. 5 is a timing chart of control signals generated in the control signal generator of FIG. 4.

FIG. 5 is a timing chart of control signals generated in control signal generator 204. As in the case of FIG. 2, the S0 to S3 signals are each shifted by a one-fourth of a cycle to produce pulses. Then, when the S0 to S3 signals are high, the D signal, R signal and F signal become high alternately.

In this case, when, for example, the S0 signal and D signal rise at t(n), integration switches 40 to 42 are turned on while the S0 signal shows the high level (see, for example, t(n) to t(n+1) of FIG. 5). Then, the above discrete signals move to convolution capacitors 40 to 42 through integration switches 52 to 54 that are turned on. As a result, the discrete signals are integrated in convolution capacitors 40 to 42.

Further, release switches 69, 71 and 73 are also turned on while the S0 signal shows the high level (see, for example, t(n) to t(n+1) of FIG. 2). Then, similar to the S0 signal, when the D signal shows the high level (see, for example, t(n) to t(n+1) of FIG. 5), dump switch 16 is turned on.

Further, for example, while the D signal shows the high level, the signals integrated in convolution capacitors 45, 47 and 49 are released to Cb 15 through release switches 69, 71 an 73 that are turned on and through dump switch 16.

Furthermore, for example, while the D signal shows the high level, (a portion of) the signals integrated in convolution capacitors 45, 47 and 49 are outputted to AD converter 205 as the output signals of in-phase mixer 110 through release switches 69, 71 and 73 that are turned on and through dump switch 16. Then, the output signals subjected to digital conversion by AD converter 205 are read in DSP 206. Further, DSP 206 generates the above-described feedback signal based on the read output signal.

Next, when the D signal falls and the R signal rises, reset switch 17 is turned on while the R signal shows the high level (see, for example, t(n) to t(n+1) of FIG. 5). Then, the signals held in convolution capacitors 40 to 51 are outputted through the ground terminals and reset.

Next, when the R signal falls and the F signal rises, feedback switch 34 is turned on while the feedback signal shows the high level (see, for example t(n) to t(n+1) of FIG. 5). Then, the above-described feedback signal is fed back from DSP 206 to the end of convolution capacity section 110 through DA converter 207 and feedback switch 34. With such a configuration, it is possible to compensate for the DC offset and differential offset of sampling miser 200 using the feedback signal.

In this way, sampling mixer 200 operates according to the control signals shown in FIG. 5. Further, with the present embodiment, the D signal, R signal and F signal are generated using a shift register formed with three registers. This shift register is included in control signal generator 204.

Further, control signal generator 204 generates the D signal, R signal and F signal by, for example, applying a signal obtained by dividing the LO signal by eight-thirds as the input clock to the shift register formed with three registers. However, methods of generating the D signal, R signal and F signal are not limited to this. The condition for generating the D signal, R signal and F signal may be set as follows.

That is, when the S0 to S3 signals are high, the D signal, R signal and F signal become high sequentially and the D signal, R signal and F signal are generated so as not to overlap each other.

In this case, for example, a shift register formed with four registers generates the D signal, R signal and F signal by applying the LO/2 signal obtained by dividing the LO signal by two, as the input clock. The D signal, R signal and F signal in this case may use three of four pulses generated by the shift register.

Next, the transfer function of the IIR filter in Embodiment 2 will be described. At t(n) of FIG. 5, discrete signals q(t) integrated in convolution capacitors 40 to 42 are represented by the following equation.

(Equation 4)

$$q(n) = (C1 + C2 + C3) \cdot x(n) \quad [4]$$

Further, the signal held in Cb 15 at t(n) of FIG. 2 is represented by the following equation.

(Equation 5)

$$C1 \cdot x(n-2) + C2 \cdot x(n-1) + C3 \cdot x(n) + Cb \cdot y(n-1) = (C1 + C2 + C3 + Cb) \cdot y(n) \quad [5]$$

Further, transfer function H of the IIR filter after the Z transform from equation 4 and equation 5, can be represented by the following equation.

(Equation 6)

$$H = \frac{C1 + C2 \cdot z^{-1} + C3 \cdot z^{-2}}{(C1 + C2 + C3)(C1 + C2 + C3 + Cb - Cb \cdot z^{-1})} \quad [6]$$

As is clear from equation 6, H has two zero points (see $z^{-1}$ and $z^{-2}$ in the numerator). Consequently, it is possible to produce notches in addition to the IIR filter characteristics represented by the denominator of equation 6. Further, as is clear from equation 6, transfer function H of the IIR filter of equation 6 can be adjusted by changing the values of C1, C2 and C3.

Next, characteristics related to sampling mixer 200 will be described. In this case, the same condition as in the case of Embodiment 1 shown in FIG. 3 is set. That is, assume that the LO signal frequency is 2.4 GHz, the capacities of convolution capacitors 40 to 51 are all 0.5 pF, the capacity of Cb 15 is 15 pF, and the transconductance of TA 1 is 7.5 mS.

Figure 6A:
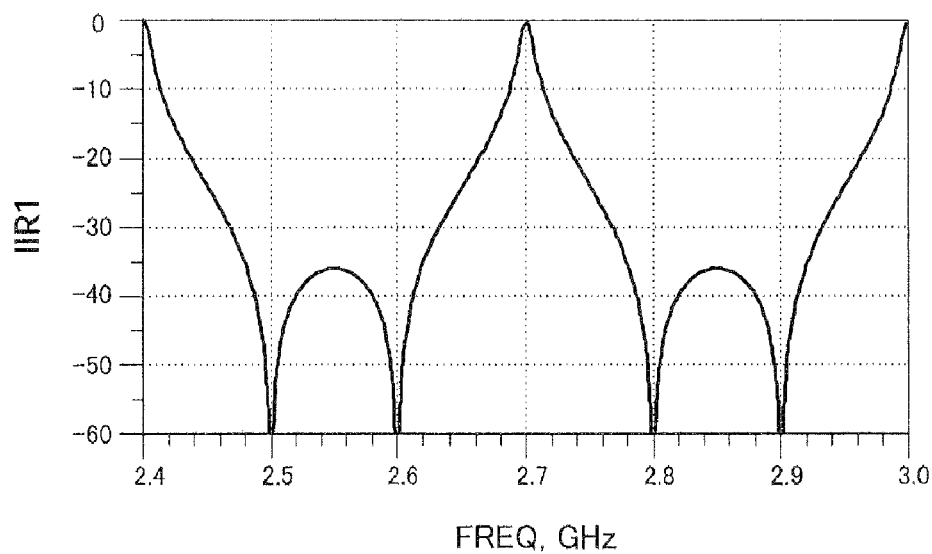
FIG. 6 shows frequency characteristics of the sampling mixer of FIG. 4.

FIG. 6A shows characteristics of the IIR filter in Embodiment 2. According to FIG. 6A, as in the case of FIG. 3A, the IIR filter characteristics (the horizontal axis is the frequency and the vertical axis is gain) change at 300 MHz intervals, because the LO signal of 2.4 GHz is decimated to a one-eighth.

Further, in the band from 2.4 GHz to 2.7 GHz, two notches are produced near 2.5 GHz and 2.6 GHz. However, these notches have wide bandwidths compared to the case of FIG. 3A.

Figure 6B:
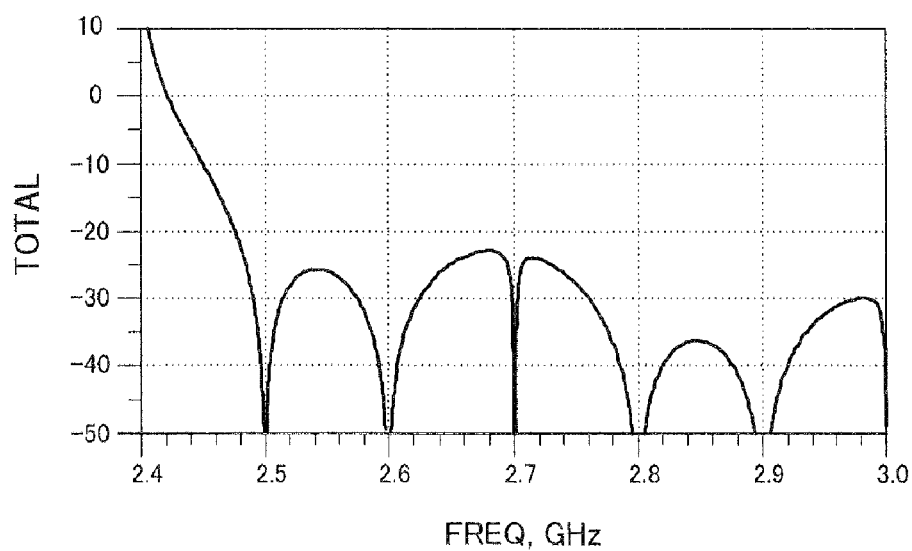

FIG. 6B shows overall characteristics of sampling mixer 200. Further, these characteristics are acquired by combining the characteristics of the IIR filter shown in FIG. 6A and the characteristics of the first step FIR filter shown in FIG. 17A.

According to FIG. 6B, near the desired wave of 2.4 GHz, the gain maximizes as in the case of FIG. 3B. However, bandwidths of notches near 2.5 GHz, 2.6 GHz, 2.8 GHz and 2.9 GHz are wide compared to the case of FIG. 3B, so that it is possible to remove interfering waves in a wider range around the notches. Further, it is possible to realize attenuation by means of notches more effectively.

As described above, sampling mixer 200 of the present embodiment is different from the case of Embodiment 1 and is able to compensate for the DC offset and differential offset based on the feedback signal. Consequently, it is possible to reduce deterioration of the sensitivity.

Embodiment 3

Figure 7:
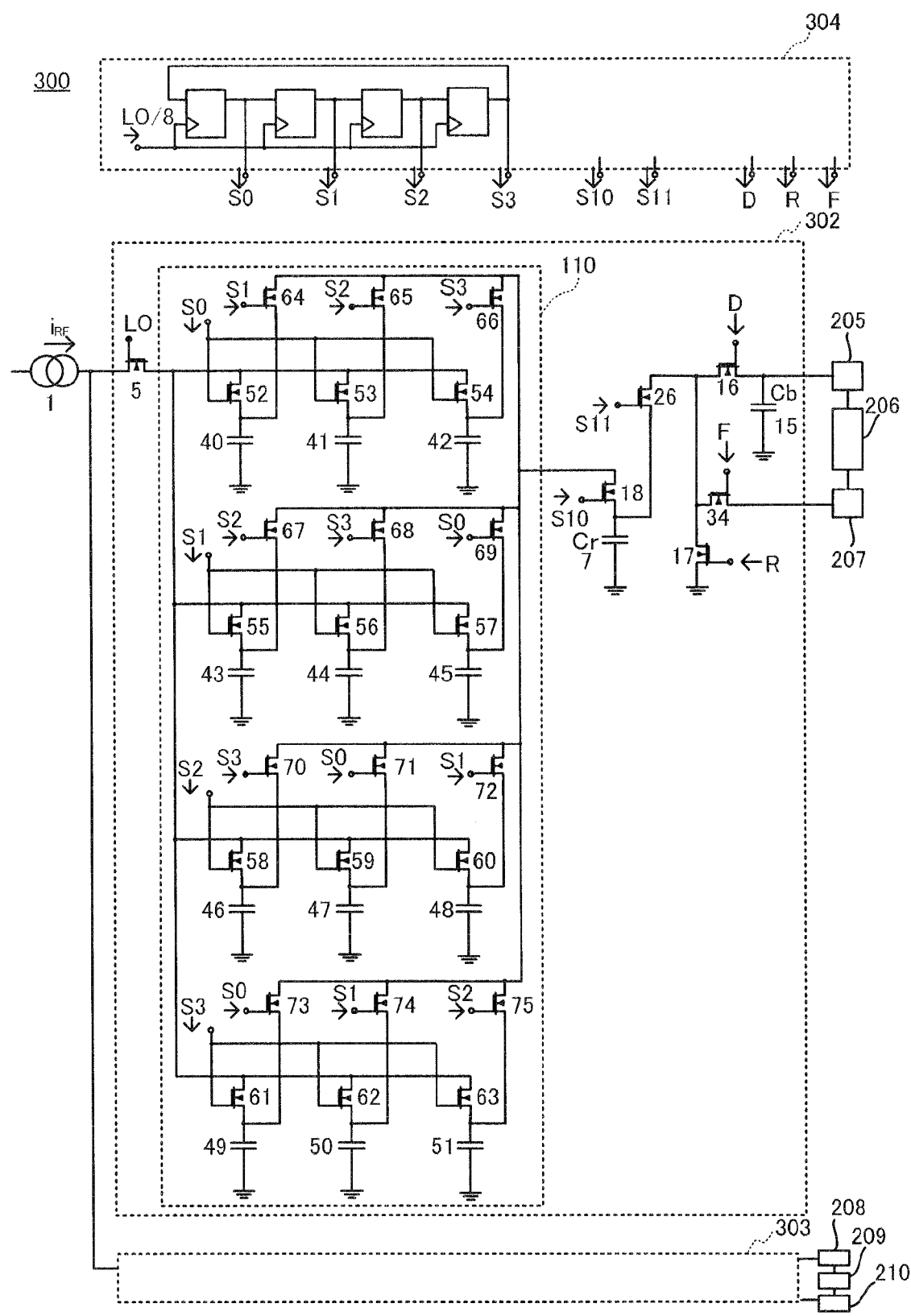
FIG. 7 shows an example of the circuit of the sampling mixer according to Embodiment 3 of the present invention.

FIG. 7 shows an example of a circuit of sampling mixer 300 according to Embodiment 3 of the present invention. Differences between the present embodiment and Embodiment 2 will be mainly described here.

Sampling mixer 300 is configured to include in-phase mixer 302, reverse phase mixer 303 and control signal generator 304 instead of in-phase mixer 202, reverse phase mixer 203 and control signal generator 204 of FIG. 4.

In-phase mixer 302 is different from the case of Embodiment 2 and further has Cr (rotate capacitor also referred to as the "second capacitor") 7, integration switch 18 and release switch 26 between the output end of convolution capacity section 110 and the drain of dump switch 16. These switches 7, 18 and 26 are composed of, for example, an n-type FET.

To be more specific, the drain of integration switch 18 is connected to the output end of convolution capacity section 110 and the source of integration switch 18 is connected to one end of Cr 7. The other end of Cr is grounded. The gate of integration switch 18 is configured to receive as input the S10 signal (described later).

The source of release switch 26 is connected between the drain of integration switch 18 and one end of Cr 7 and the drain of release switch 26 is connected to the drain of dump switch 16. The gate of release switch is configured to receive as input the S11 signal (described later).

Control signal generator 304 further generates the above-described S10 signal and S11 signal in addition to the S0 to S3 signals, D signal, R signal and F signal. The S10 signal rises during the first half of the period one of the S0 to S3 signals rises. On the other hand, the S11 signal rises during the second half of the above period.

The S10 signal operates as the gate signal of integration switch 18 and the S11 signal operates as the gate signal of release switch 26.

Further, reverse phase mixer 303 is configured in the same way as in-phase mixer 302. The other configuration of sampling mixer 300 is virtually the same as in the case of Embodiment 2 and so repetition of description will not be described.

With such a configuration, in addition to the effect of the IIR filter (this will be referred to as the "first step IIR filter") composed of convolution capacity section 110 and Cr 7, sampling mixer 300 produces an effect of an IIR filter (this will be referred to as the "second step IIR filter") composed of Cr 7 and Cb 15, which will be described later.

Figure 8:
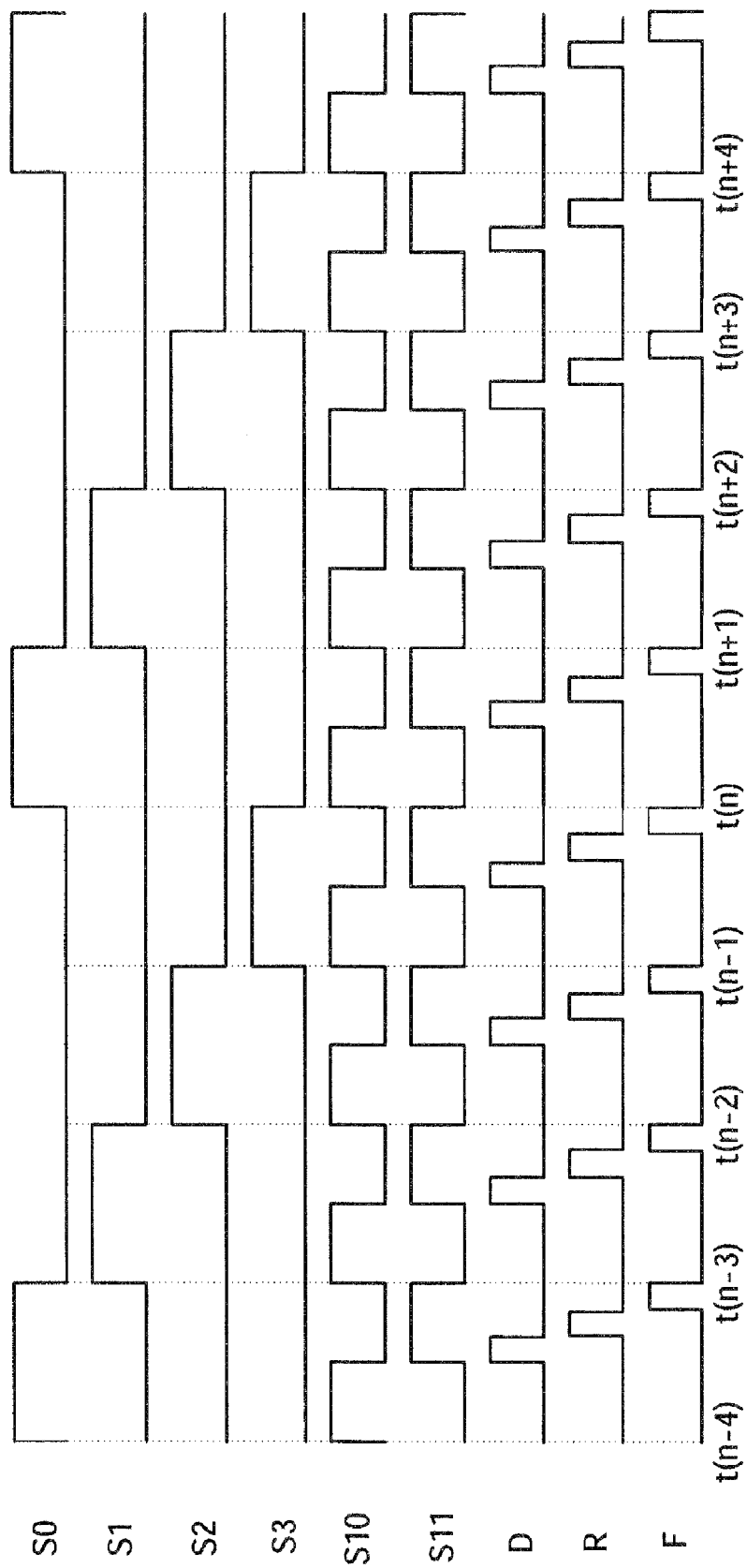
FIG. 8 is a timing chart of control signals generated in the control signal generator of FIG. 7.

FIG. 8 is a timing chart of control signals generated in control signal generator 304. In this case, given that the S0 to S3 signals, D signal, R signal and F signal are virtually the same as in the case of FIG. 5, the S10 signal and S11 signal will be mainly described.

Then, when one of the S0 to S3 signals shows the high level, the S10 signal and the S11 signal show the high level alternately.

When, for example, the S0 signal and S10 signal rise at t(n), integration switches 40 to 42 are turned on while the S0 signal shows the high level (see, for example, t(n) to t(n+1) of FIG. 5). Then, the above discrete signals move to convolution capacitors 40 to 42 and integrated. Further, release switches 69, 71 and 73 are turned on while the S0 signal shows the high level (see, for example, t(n) to t(n+1) of FIG. 8).

Then, when the S10 signal rises, integration switches 18 is turned on while the S10 signal shows the high level (see, for example, t(n) to t(n+1) of FIG. 8). Then, the signals integrated in convolution capacitors 45, 47 and 49 are released to Cr 7 through integration switch 18 that is turned on.

Next, when the S10 signal falls and the S11 signal and D signal rise together, release switch 26 and dump switch 16 are turned on while the S11 signal and D signal show the high level (see, for example, t(n) to t(n+1) of FIG. 8). Then, the signal held in Cr 7 is released to Cb 15 while the D signal shows the high level. By this means, it is possible to produce an effect of the second step IIR filter composed of Cr 7 and Cb 15.

Next, when the D signal falls and the R signal rises (see, for example, t(n) to t(n+1) of FIG. 8), reset switch 17 is turned on while the R signal shows the high level. Then, the signal held in Cr 7 is outputted to the ground terminal end and reset.

Next, when the R signal falls and the F signal rises (see, for example, t(n) to t(n+1) of FIG. 8), feedback switch 34 is turned on while the feedback signal shows the high level. In this case, as in the case of Embodiment 2, it is possible to compensate for the DC offset and differential offset of sampling mixer 300 using the above-described feedback signal.

In this way, sampling mixer 300 operates according to the control signals shown in FIG. 8.

Further, with Embodiment 3, the S10 signal and S11 signal are obtained by dividing the LO signal by eight. However, if the period the S0 signal shows the high level matches the period of w cycles of the LO signal, the S10 signal and S11 signal refer to a signal obtained by dividing the LO signal by w.

Further, the D signal, R signal and F signal are generated using a shift register formed with six registers. This shift register is included in control signal generator 304.

Although control signal generator 304 generates the D signal, R signal and F signal by applying a signal obtained by dividing the LO signal by four-thirds as the input clock to the shift register formed with six registers, methods of generating the D signal, R signal and F signal are not limited to this.

The condition for generating the D signal, R signal and F signal may be set as follows. That is, when the S11 signal, which has the same cycle as the S10 signal, is high, the D signal, R signal and F signal sequentially become high and the D signal, R signal and F signal are set so as not to overlap each other.

In this case, for example, a shift register formed with eight registers generates the D signal, R signal and F signal by applying the LO signal as the input clock. The D signal, R signal and F signal may use three of eight pulses generated by the shift register, as long as the condition that the three pulses in this case show the high level when S11 signal shows the high level, is met.

Next, the transfer function of the first step IIR filter composed of convolution capacitors 40 to 51 and Cr 7 in Embodiment 3 will be described.

At t(n) of FIG. 8, discrete signals q (n) integrated in convolution capacitors 40 to 42 are represented by the following equation.

(Equation 7)

$$C1 \cdot y(n-3) + C2 \cdot y(n-2) + C3 \cdot y(n-1) + q(n) = (C1 + C2 + C3) \cdot x(n) \quad [7]$$

Further, the signal held in Cb 15 at t(n) of FIG. 8 is represented by the following equation.

(Equation 8)

$$C1 \cdot x(n-2) + C2 \cdot x(n-1) + C3 \cdot x(n) = (C1 + C2 + C3 + Cr) \cdot y(n) \quad [8]$$

Further, transfer function H of the IIR filter after the Z transform from equation 7 and equation 8, can be represented by the following equation.

(Equation 9)

$$H = \frac{C1 + C2 \cdot z^{-1} + C3 \cdot z^{-2}}{(C1 + C2 + C3)(C1 + C2 + C3 + Cr) - (C1 \cdot z^{-3} + C2 \cdot z^{-2} + C3 \cdot z^{-1})(C1 + C2 \cdot z^{-1} + C3 \cdot z^{-2})} \quad [9]$$

As is clear from equation 9, H has two zero points (see $z^{-1}$ and $z^{-2}$ in the numerator). Consequently, it is possible to produce notches in addition to the IIR filter characteristics represented by the denominator of equation 9. Further, as is clear from equation 9, the IIR filter characteristics of equation 9 can be adjusted by changing the values of C1, C2 and C3.

Next, characteristics related to sampling mixer 300 will be described. In this case, capacities of convolution capacitors 40 to 51 are all 1.0 pF and the capacity of Cr 7 is 0.5 pF. The other conditions are the same as in Embodiment 2. That is, assume that the LO signal frequency is 2.4 GHz, the capacity of Cb 15 is 15 pF, and the transconductance of TA 1 is 7.5 mS. Further, the above-described values including 0.5 pF of Cr 7 may be changed.

Figure 9A:
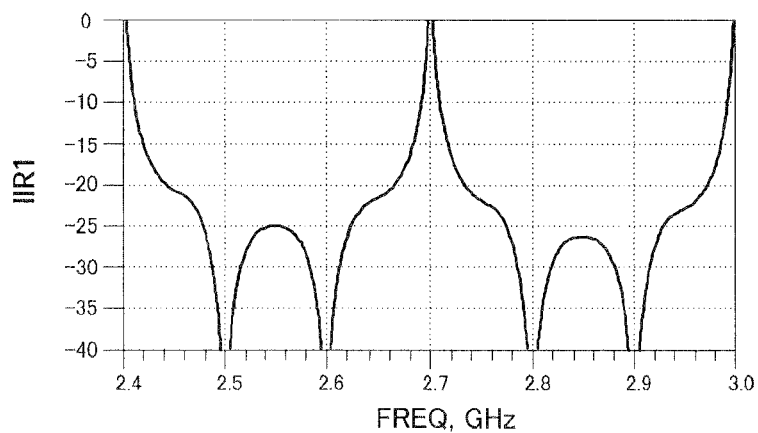
FIG. 9 shows characteristics of the sampling mixer of FIG. 7.

FIG. 9A shows characteristics of the first step IIR filter composed of convolution capacitors 40 to 51 and Cr 7.

According to FIG. 9A, as in the case of FIG. 6A, the IIR filter characteristics (the horizontal axis is the frequency and the vertical axis is gain) change at 300 MHz intervals, because the LO signal of 2.4 GHz is decimated to a one-eighth.

Further, in the band from 2.4 GHz to 2.7 GHz, notches with a wide bandwidth compared to the case of FIG. 6A are produced near 2.5 GHz and near 2.6 GHz.

Figure 9B:
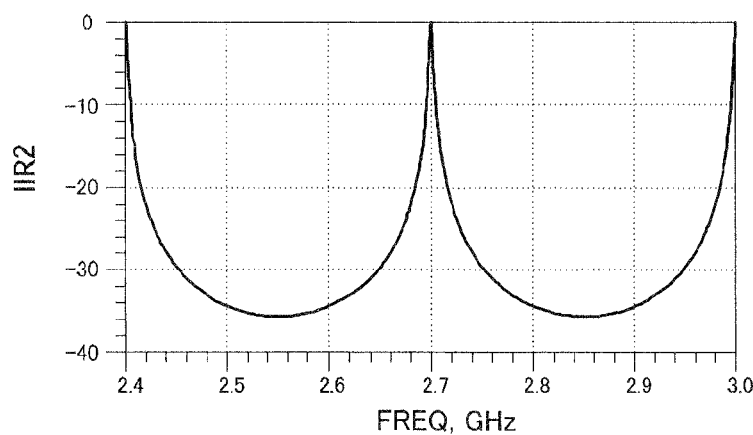

FIG. 9B shows characteristics of the second step IIR filter composed of Cr 7 and Cr 15 in Embodiment 3.

According to FIG. 9B, the IIR filter characteristics (the horizontal axis is the frequency and the vertical axis is gain) changes at 300 MHz intervals, because the LO signal of 2.4 GHz is decimated to a one-eighth.

Figure 9C:
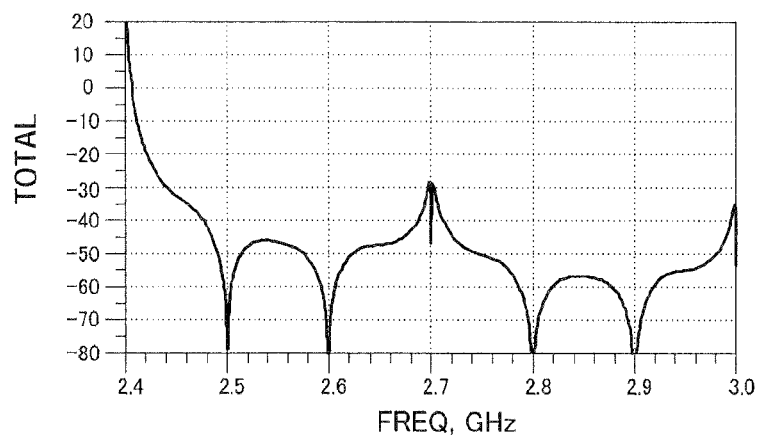

FIG. 9C shows overall characteristics of sampling mixer 300. Further, these characteristics are acquired by combining characteristics shown in FIG. 9A, FIG. 17A and FIG. 9B.

FIG. 9C shows that gain decreases near the desired wave of 2.4 GHz compared to the case of FIG. 6B, allowing only the desired wave pass at ease.

Further, as in the case of FIG. 6B, there are notches near 2.5 GHz, 2.6 GHz, 2.8 GHz and 2.9 GHz, so that it is possible to remove interfering waves near these frequencies by means of the notches.

Further, although the number of Cr 7 is one with Embodiment 3, the number of Cr 7 is not limited to this and may be changed. For example, sampling mixer 300 may be configured to include a plurality of Cr 7 and connect these Cr 7 to Cb 15 at the same time. In this case, by decimating the sampling rate, it is possible to decrease the operation speed required for the AD converter and consequently reduce consumption current.

Further, Cr and Cb (not shown) may additionally be connected in cascade to the next stage of Cb 15.

As described above, according to the present embodiment, sampling mixer 300 has: Cr 7 provided between convolution capacity section 110 and first capacitor 15; integration switch 18 that switches the inputted state of the output signal of convolution capacity section 110 to Cr 7; and release switch 26 that switches the outputted state of a signal integrated in Cr 7 to first capacitor 15 connected to one end of Cr 7.

With this configuration, by carrying out control during the period one of release switches 64 to 75 is turned on such that integration switch 18 is turned on during the first half of the period and release switch 26 is turned on during the second half of the period, the gain near the desired wave decreases thanks to the filter characteristics, so that it is possible to realize a sampling mixer that allows only the desired wave to pass at ease.

Embodiment 4

Figure 10:
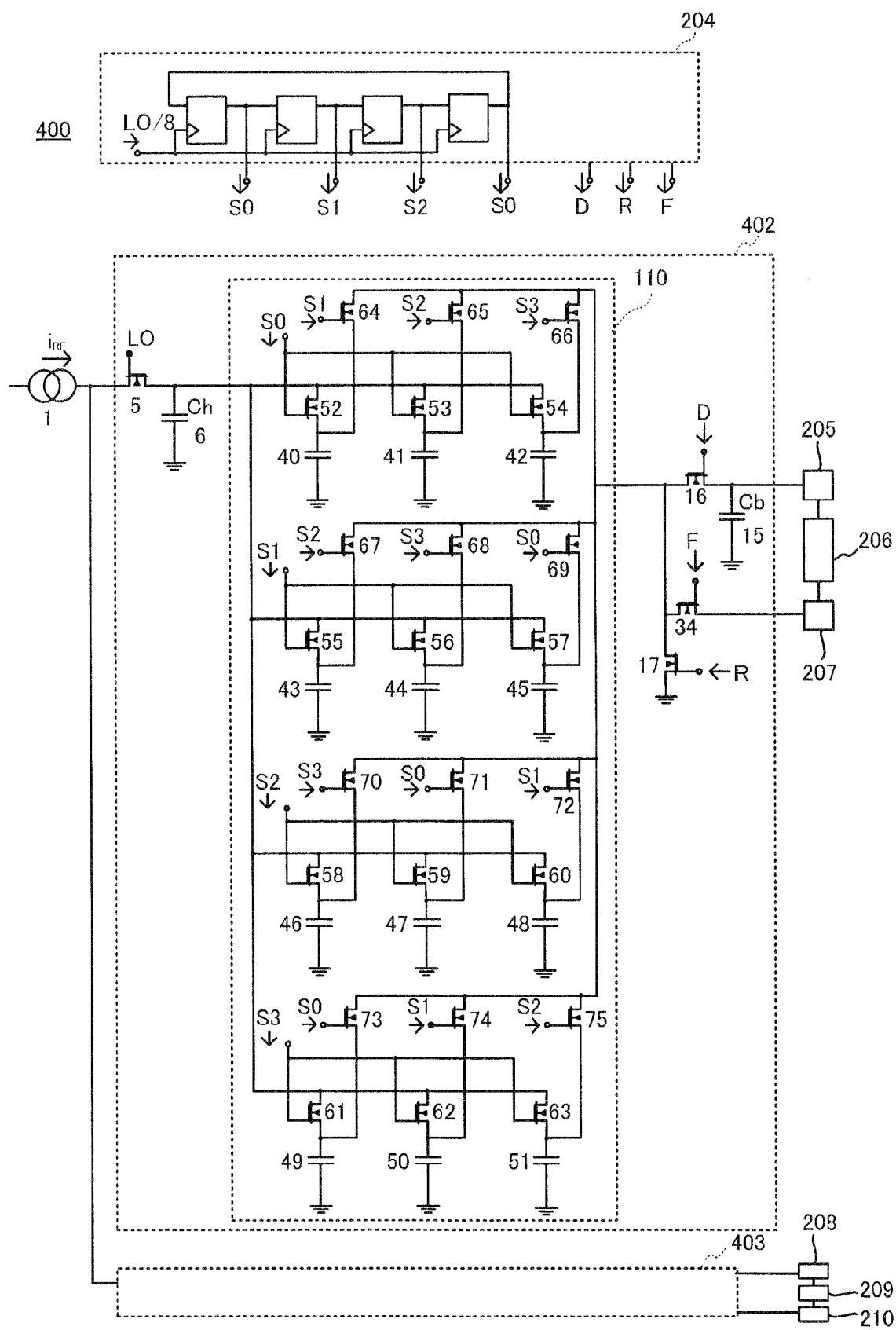
FIG. 10 shows an example of the circuit of the sampling mixer according to Embodiment 4 of the present invention.

FIG. 10 shows an example of a circuit of sampling mixer 400 according to Embodiment 4 of the present invention. Differences between the present embodiment and Embodiment 2 will be mainly described here.

Sampling mixer 400 is configured to include in-phase mixer 402 and reverse phase mixer 403 instead of in-phase mixer 202 and reverse phase mixer 203 in Embodiment 2 of FIG. 4.

In-phase mixer 402 is different from the case of Embodiment 2 and further has Ch (history capacitor also referred to as the "third capacitor") 6 with one end further connected between the drain of sampling switch 5 and the input end of convolution capacity section 110. Further, the other end of Cr 6 is grounded.

Further, reverse phase mixer 403 is configured in the same way as in-phase mixer 402. The other configuration of sampling mixer 400 is virtually the same as in the case of Embodiment 2 and so repetition of description will not be described.

With such a configuration, in addition to the effect of the IIR filter composed of convolution capacity section 110 and Cb 15, sampling mixer 400 produces an effect of an IIR filter composed of Ch 6 and convolution capacity section 110, which will be described later.

Next, the transfer function of the IIR filter, which is composed of Ch 6 and convolution capacity section 110 in Embodiment 4, after the Z transform, can be represented by the following equation. Further, the capacity of Ch 6 is Ch.

(Equation 10)

$$H = \frac{1}{C1 + C2 + C3 + Ch - Ch \cdot z^{-1}} \quad [10]$$

Further, the transfer function of the IIR filter, which is composed of convolution capacity section 110 and Cb 15, after the Z transform, can be represented by above equation 6.

Next, characteristics related to sampling mixer 400 will be described. In this case, the capacity of Ch is 10 pF. The other conditions are the same as in Embodiment 2. That is, assume that the LO signal frequency is 2.4 GHz, the capacities of convolution capacitors 40 to 51 are all 0.5 pF, the capacity of Cb 15 is 15 pF, and the transconductance of TA 1 is 7.5 mS. Further, the above-described values including 10 pF of Ch 6 may be changed.

Figure 11A:
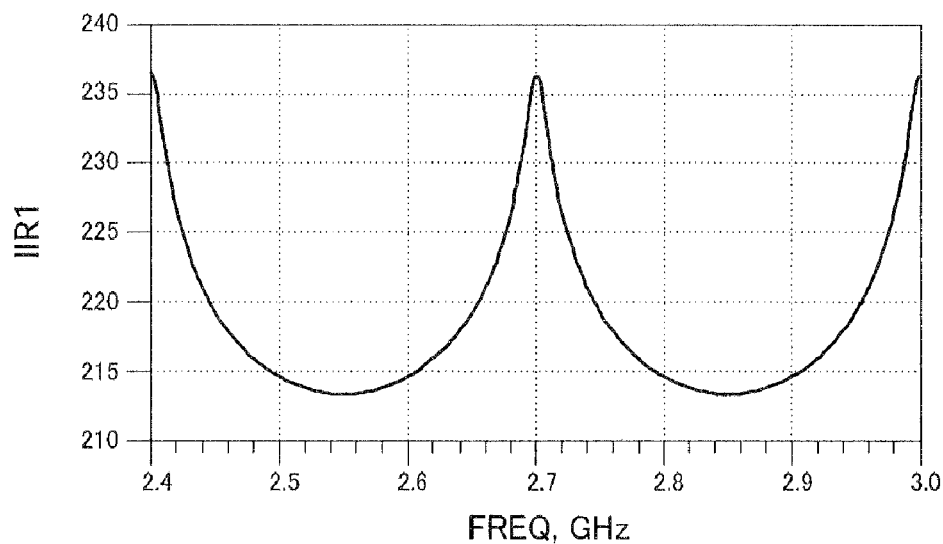
FIG. 11 shows frequency characteristics of the sampling mixer of FIG. 10.

FIG. 11A shows characteristics of the IIR filter composed of Ch 6 and convolution capacity section 110.

According to FIG. 11A, as in the case of FIG. 6A, the IIR filter characteristics (the horizontal axis is the frequency and the vertical axis is gain) change at 300 MHz intervals.

Figure 11B:
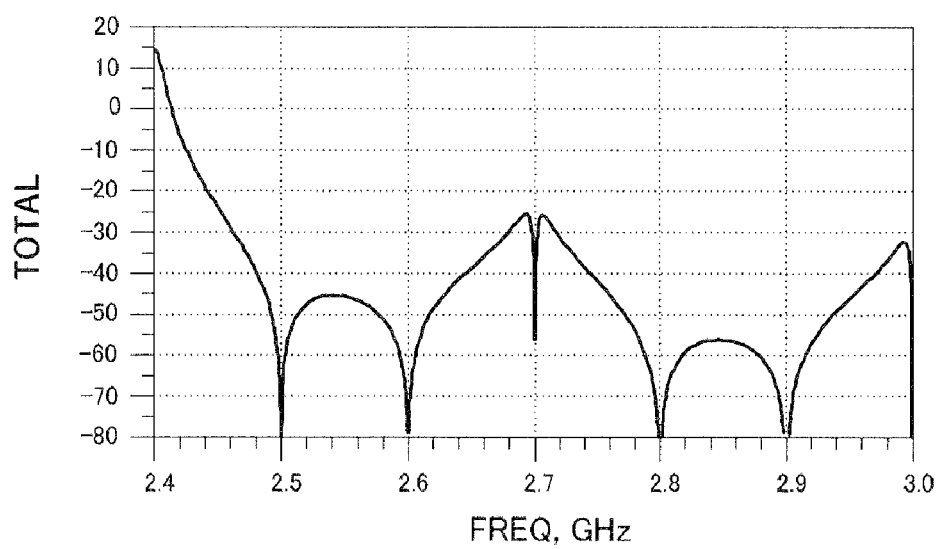

FIG. 11B shows overall characteristics of sampling mixer 400. Further, these characteristics are acquired by combining characteristics shown in FIG. 11A, FIG. 6A and FIG. 17A.

FIG. 11B shows that gain decreases near the desired wave of 2.4 GHz compared to the case of FIG. 6B, allowing only the desired wave pass at ease.

Further, compared to the case of FIG. 6B, notches near 2.5 GHz, 2.6 GHz, 2.8 GHz and 2.9 GHz become deep, so that it is possible to remove interfering waves near these frequencies by means of the notches.

Further, Cr and Cb (not shown) may additionally be connected in cascade to the next stage of Cb 15 in Embodiment 4.

Embodiment 5

Figure 12:
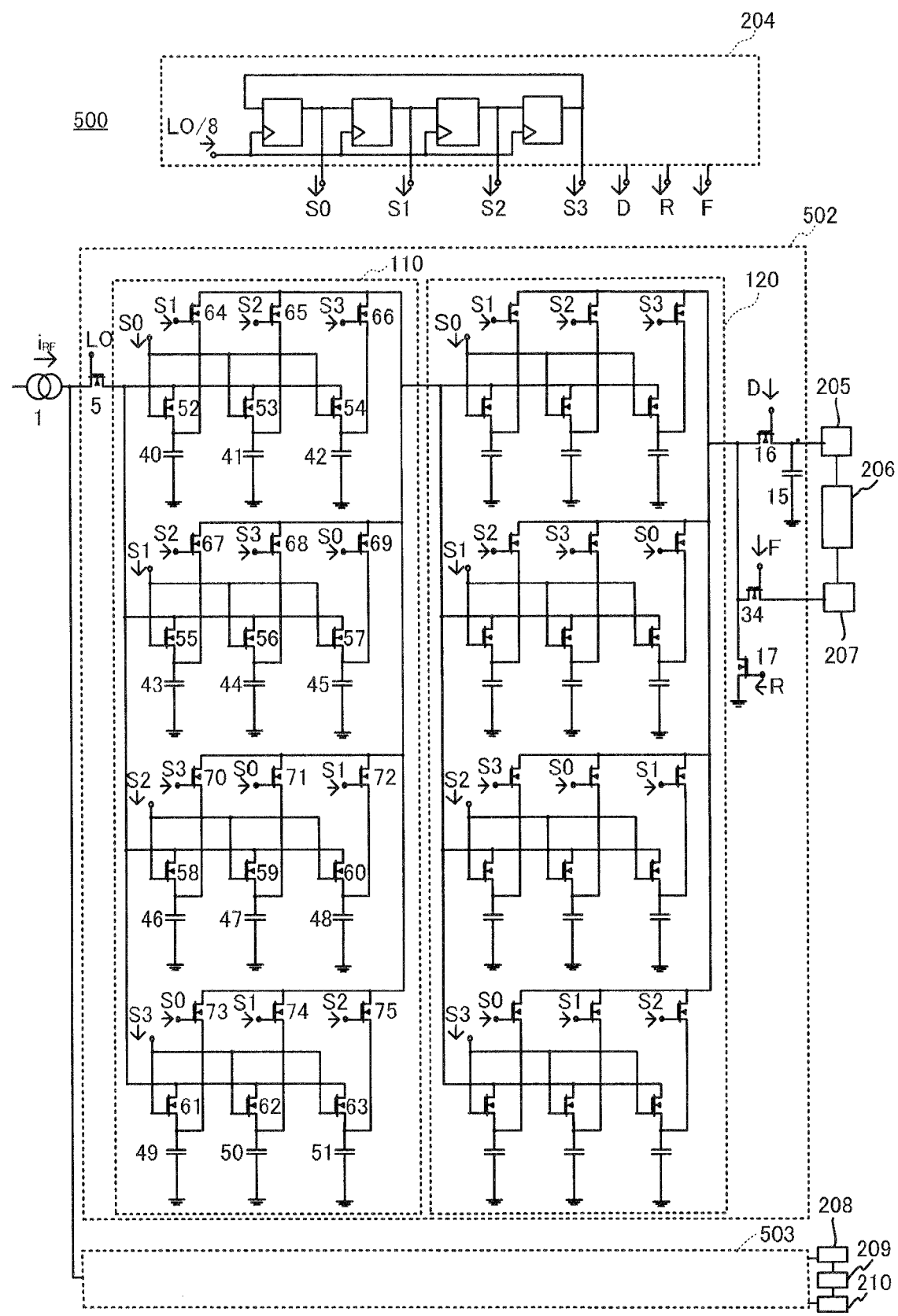
FIG. 12 shows an example of the circuit of the sampling mixer according to Embodiment 5 of the present invention.

FIG. 12 shows an example of a circuit of sampling mixer 500 according to Embodiment 5 of the present invention. Differences between the present embodiment and Embodiment 2 will be mainly described here.

Sampling mixer 500 is configured to include in-phase mixer 502 and reverse phase mixer 503 instead of in-phase mixer 202 and reverse phase mixer 203 in Embodiment 2 of FIG. 4.

In-phase mixer 502 further includes convolution capacity section 120 connected in series with convolution capacity section 110, in addition to convolution capacity section 110 in Embodiment 2 of FIG. 4. Further, convolution capacity section 120 is configured in the same way as convolution capacity section 110.

Furthermore, reverse phase mixer 503 is configured in the same way as in-phase mixer 502. The other configuration of sampling mixer 500 is virtually the same as in the case of Embodiment 2 and so repetition of description will not be described.

With such a configuration, in addition to the effect of the IIR filter composed of convolution capacity section 120 and Cb 15, sampling mixer 500 produces an effect of an IIR filter composed of convolution capacity section 110 and convolution capacity section 120, which will be described later.

Next, the transfer function of the IIR filter, which is composed of convolution capacity section 110 and convolution capacity section 120, after the Z transform, can be represented by the following equation.

(Equation 11)

$$H = \frac{C1 + C2 \cdot z^{-1} + C3 \cdot z^{-2}}{(C1 + C2 + C3)(2C1 + 2C2 + 2C3) - (C1 \cdot z^{-3} + C2 \cdot z^{-2} + C3 \cdot z^{-1})(C1 + C2 \cdot z^{-1} + C3 \cdot z^{-2})} \quad [11]$$

Further, the transfer function of the IIR filter, which is composed of convolution capacity section 120 and Cb 15, after the Z transform, can be represented by equation 6.

Next, characteristics related to sampling mixer 500 will be described. In this case, capacities of convolution capacitor 40 to 51 in convolution capacity sections 110 and 120 are all 1 pF. The other conditions are the same as in Embodiment 2. That is, assume that the LO signal frequency is 2.4 GHz, the capacity of Cb 15 is 15 pF, and the transconductance of TA 1 is 7.5 mS.

Figure 13A:
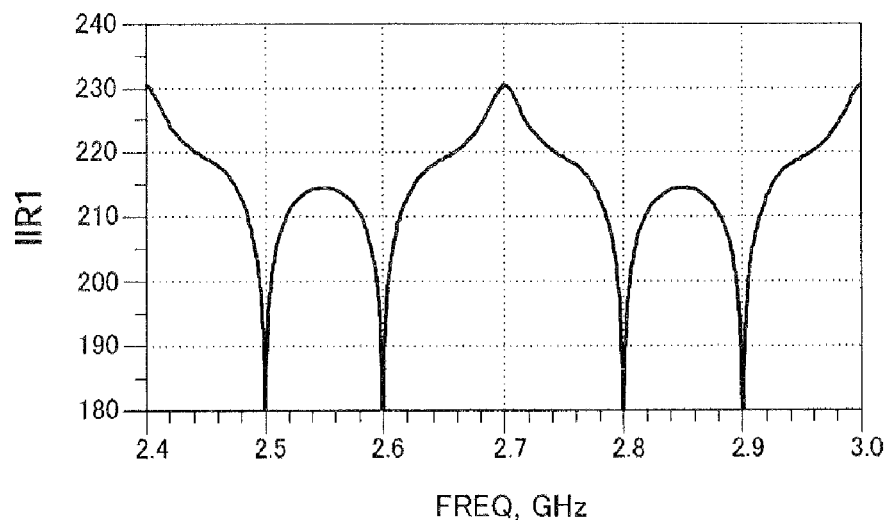
FIG. 13 shows frequency characteristics of the sampling mixer of FIG. 12.

FIG. 13A shows characteristics of the IIR filter composed of convolution capacity section 110 and convolution capacity section 120.

According to FIG. 13A, as in the case of FIG. 6A, the IIR filter characteristics (the horizontal axis is the frequency and the vertical axis is gain) change at 300 MHz intervals.

Figure 13B:
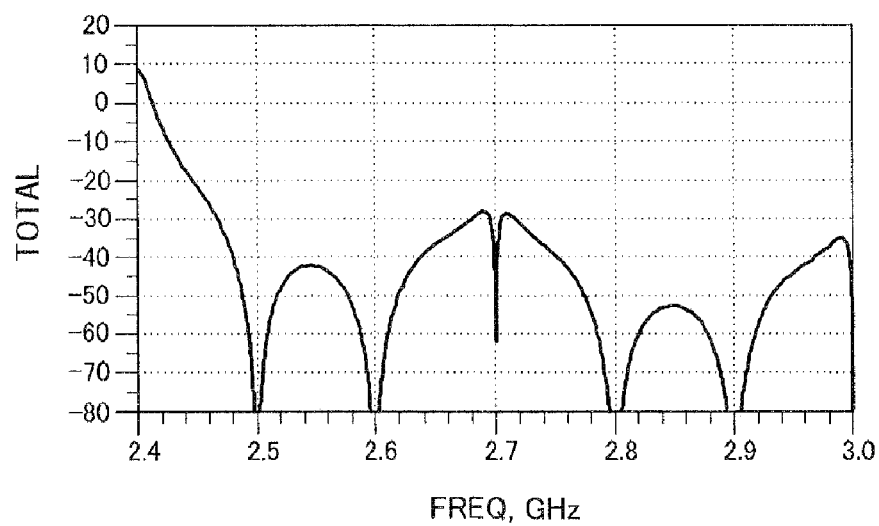

FIG. 13B shows overall characteristics of sampling mixer 500. Further, these characteristics are acquired by combining characteristics shown in FIG. 13A, FIG. 6A and FIG. 17A.

FIG. 13B shows that gain decreases near the desired wave of 2.4 GHz compared to the case of FIG. 6B, allowing only the desired wave pass at ease.

Further, compared to the case of FIG. 6B, notches near 2.5 GHz, 2.6 GHz, 2.8 GHz and 2.9 GHz become deep, so that it is possible to remove an interfering wave near these frequencies by means of the notches.

Further, although capacities of convolution capacitors in convolution capacity sections 110 and 102 are the same with Embodiment 5, the capacities may be changed. By, for example, changing the capacities of convolution capacitors, the overall characteristics of sampling mixer 500 may be adjusted to desired characteristics.

Further, although the capacities of convolution capacitors in convolution capacity sections 110 and 120 are all the same and total capacities in convolution capacity sections 110 and 120 are the same, the present invention is not limited to this. By, for example, setting the above total capacities to vary between convolution capacity sections 110 and 120, the number of notches may be changed.

Further, although a case has been described where two convolution capacity sections 110 and 120 are used, three or more convolution capacity sections may be applied. In this case, the present invention is useful because, when the number of convolution capacity sections connected in series increases, the degree of attenuation in the overall filter characteristic of sampling mixer 500 increases.

Embodiment 6

Figure 18:
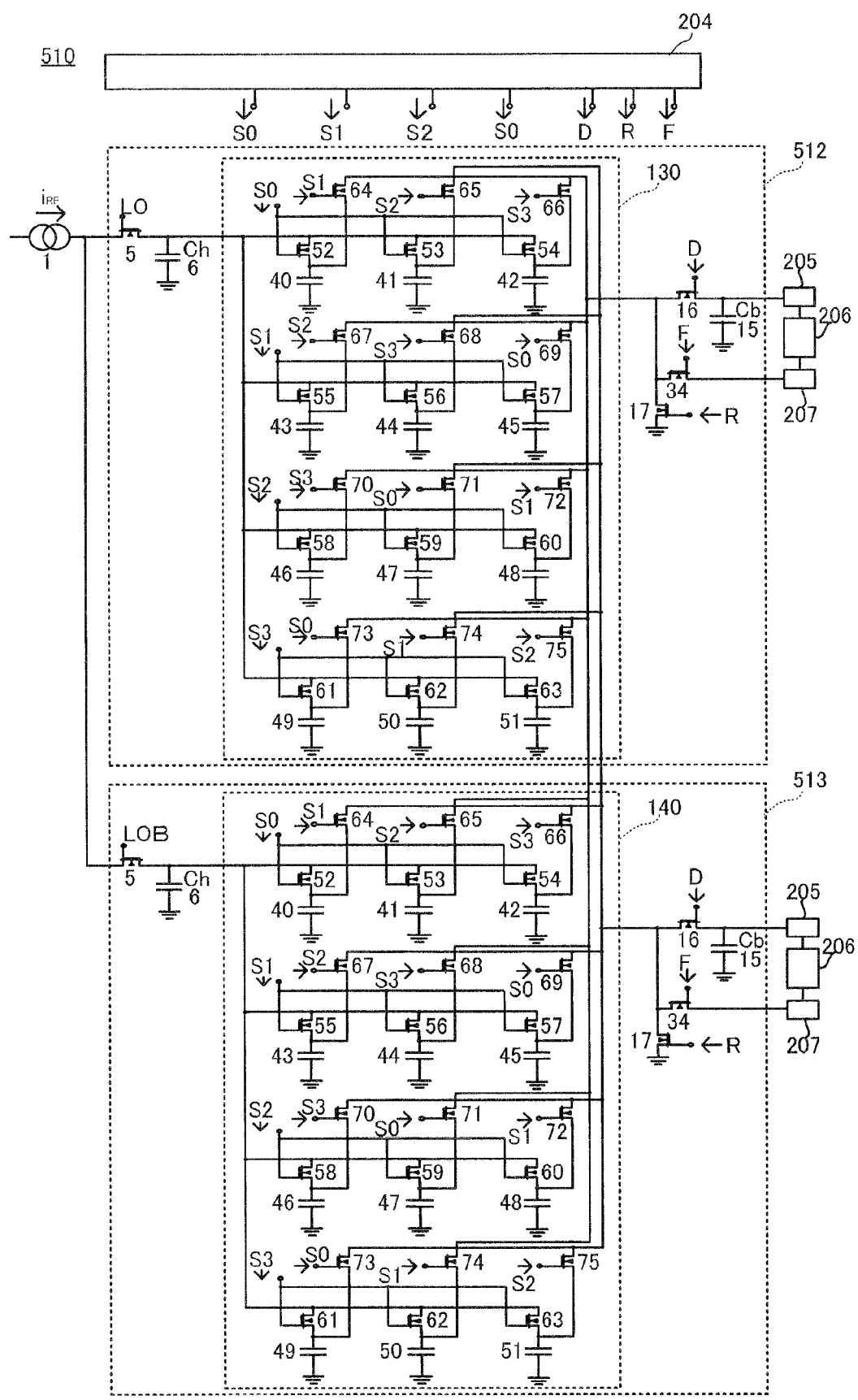
FIG. 18 shows an example of the circuit of the sampling mixer according to Embodiment 6 of the present invention.

FIG. 18 shows an example of a circuit of sampling mixer 510 according to Embodiment 6 of the present invention. Differences between the present embodiment and Embodiment 4 will be mainly described here.

Sampling mixer 510 is configured to include in-phase mixer 512 and reverse phase mixer 513 instead of in-phase mixer 402 and reverse phase mixer 403 in Embodiment 4 of FIG. 10. In-phase mixer 512 has convolution capacity section 130. Reverse phase mixer 513 has convolution capacity section 130.

Convolution capacity section 130 of in-phase mixer 512 outputs signals integrated in convolution capacitors 41, 44, 47 and 50 to Cb 15 of reverse phase mixer 513. Similarly, convolution capacity section 140 of reverse phase mixer 513 outputs signals integrated in convolution capacitors 41, 44, 47 and 50 to Cb 15 of in-phase mixer 513. The other configuration of sampling mixer 510 is virtually the same as in the case of Embodiment 4 and so repetition of description will not be described.

With such a configuration, notches of the IIR filter composed of convolution capacity sections 130 and 140 and Cb 15 can be designed with more flexibility in sampling mixer 510.

The capacity values of convolution capacitors 40, 43, 46 and 49 are C1, the capacity values of convolution capacitors 41, 44, 47 and 50 are C2, the capacity values of convolution capacitors 42, 45, 48 and 51 are C1 and the capacity value of the buffer capacity is Cb. Then, transfer function H of the IIR filter which is composed of convolution capacity sections 130 and 140 and Cb 15 can be represented by the following equation.

(Equation 12)

$$H = \frac{C1 - C2z^{-1} + C1z^{-2}}{(C1 + C2 + C3 + Cb) - Cbz^{-1}} \quad [12]$$

The numerator of equation 12 can be deformed as follows.

(Equation 13)

$$C1 - C2z^{-1} + C1z^{-2} = C1\left(z^{-2} - \frac{C2}{C1}z^{-1} + 1\right) \quad [13]$$
$$= C1(z^{-2} - 2az^{-1} + a^2 + b^2)$$
$$= C1\{z^{-1} - (a+jb)\}$$
$$\{z^{-1} - (a-jb)\}$$

where $$\frac{C2}{C1} = 2a, \ a^2 + b^2 = 1$$

As is clear from equation 13, the numerator of equation 12 has the pole of the complex conjugate when the absolute value is 1. By this means, according to the ratio of the capacities of C2 and C1, it is possible to design two notches in filter characteristics. In this case, one notch can be set to an arbitrary frequency and the other notch appears symmetrically with respect to the center of a certain range of a frequency. The range of the frequency is determined by the sampling frequency of the signal outputted from convolution capacity section 130 to Cb 15.

To be more specific, if the sampling frequency of the signal outputted from convolution capacity section 130 to Cb 15 is 300 MHz and one notch is designed to appear at a frequency 20 MHz de tuned from the LO signal frequency, the other notch appears at a frequency 280 MHz detuned from the LO signal frequency.

As described above, notches can be designed to appear at an arbitrary frequency in sampling mixer 510 of Embodiment 6. Then, it is possible to remove interfering waves by setting the frequency at which notches appear to match with the frequency at which arbitrary interfering waves appear.

Further, although, with the present embodiment, the number of convolution capacitors that integrate outputs from the sampling switch is three, the number of convolution capacitors is not limited to this.

Generally speaking, in the case where the number of notches that can be designed at random is n, the required number of convolution capacitors that integrate outputs from the sampling switch at the same time, that is, the number of convolution capacitors m included in an integration unit, is m=2n+1

Further, in the case where m convolution capacitors in one integration unit are connected with Cb 15 sequentially from the first to the m-th capacitor and output discrete signals sequentially, convolution capacitors that are connected with Cb 15 in an even-numbered turn need to be connected with Cb 15 of the mixer where the phase is reversed. With Embodiment 6, convolution capacitors 41, 44, 47 and 50 are applicable in this case.

According to the present embodiment, in convolution capacity section 130 of sampling mixer 510, while release switches that are turned on in even-numbered turns from timings at which the states of the integration switches switch, are connected with Cb 15 of reverse phase mixer 513, release switches that are turned on in an odd-number turn, are connected with Cb 15 of in-phase mixer 512. Further, in integration units of convolution capacity section 140, while release switches that are turned on in an odd-number turn from timings at which the states of the integration switches switch, are connected with Cb 15 of reverse phase mixer 513, release switches that are turned on in an odd-number turn, are connected with Cb 15 of in-phase mixer 512.

With such a configuration, the numerator of transfer function H of the IIR filter in sampling mixer 510 has the pole of the complex conjugate when the absolute value is 1. Consequently, by adjusting the capacities of the convolution capacitors, it is possible to more flexibly adjust the locations of frequencies at which notches appear. As in the above embodiments, the number of notches can be adjusted by the number of convolution capacitors m arranged in parallel in the integrations units.

With the above description, a configuration has been described where release switches that are turned on in even-number turns from timings at which the states of integration switches switch, are connected with Cb 15 of reverse phase mixer 513 in convolution capacity section 130 and are fixed, and integration units of convolution capacity section 140 are connected with Cb 15 of in-phase mixer 512 and fixed.

However, the present invention is not limited to this. For example, a configuration may be possible where wirings that connect Cb 15 of reverse phase mixer 513 with integration units and wirings that connect Cb 15 of in-phase mixer 512 with integration units are prepared to arrange a switch that switches the states of connection between integration units and the wirings. In this case, in convolution capacity section 130, at even-numbered release timings from timings at which the states of integration switches switch, the switch that switches the states of connection between the integration units and the wirings, switch to the state in which Cb 15 of reverse phase mixer 513 is connected with the switch. On the other hand, in convolution capacity section 140, at even-numbered release timings from timings at which the states of the integration switches switch, the switch that switches the states of connection between the integration units and the wirings, switch to the state in which Cb 15 of in-phase mixer 512 is connected with the switch.

That is, the integration units of convolution capacity section 130 need to release discrete signals integrated in m integration elements to Cb 15 of reverse phase mixer 513 at specific release timings out of m release timings associated with the m integration elements, and release discrete signals to Cb 15 of in-phase mixer 512 at the other release timings than the specific release timings. The integration units of convolution capacity section 140 only need to release discrete signals integrated in m integration elements to capacitors opposite to the integration units of convolution capacity section 130, at the same release timings as the integration units of applicable convolution capacity section 130. The specific release timings refer to even-numbered release timings out of the m release timings.

Embodiment 7

Figure 14:
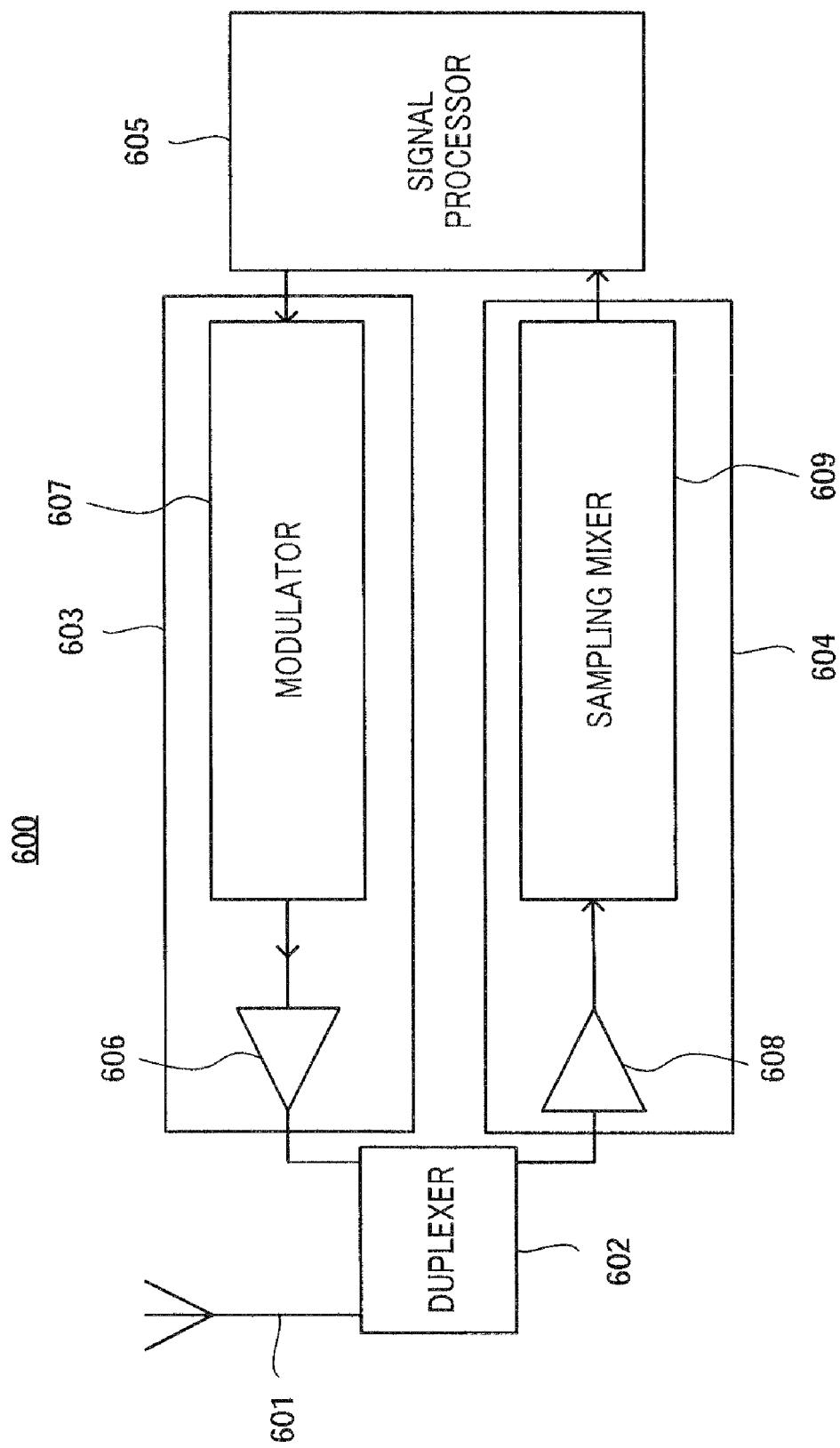
FIG. 14 is a block diagram showing a configuration example of a radio apparatus according to Embodiment 7 of the present invention.
Figure 15:
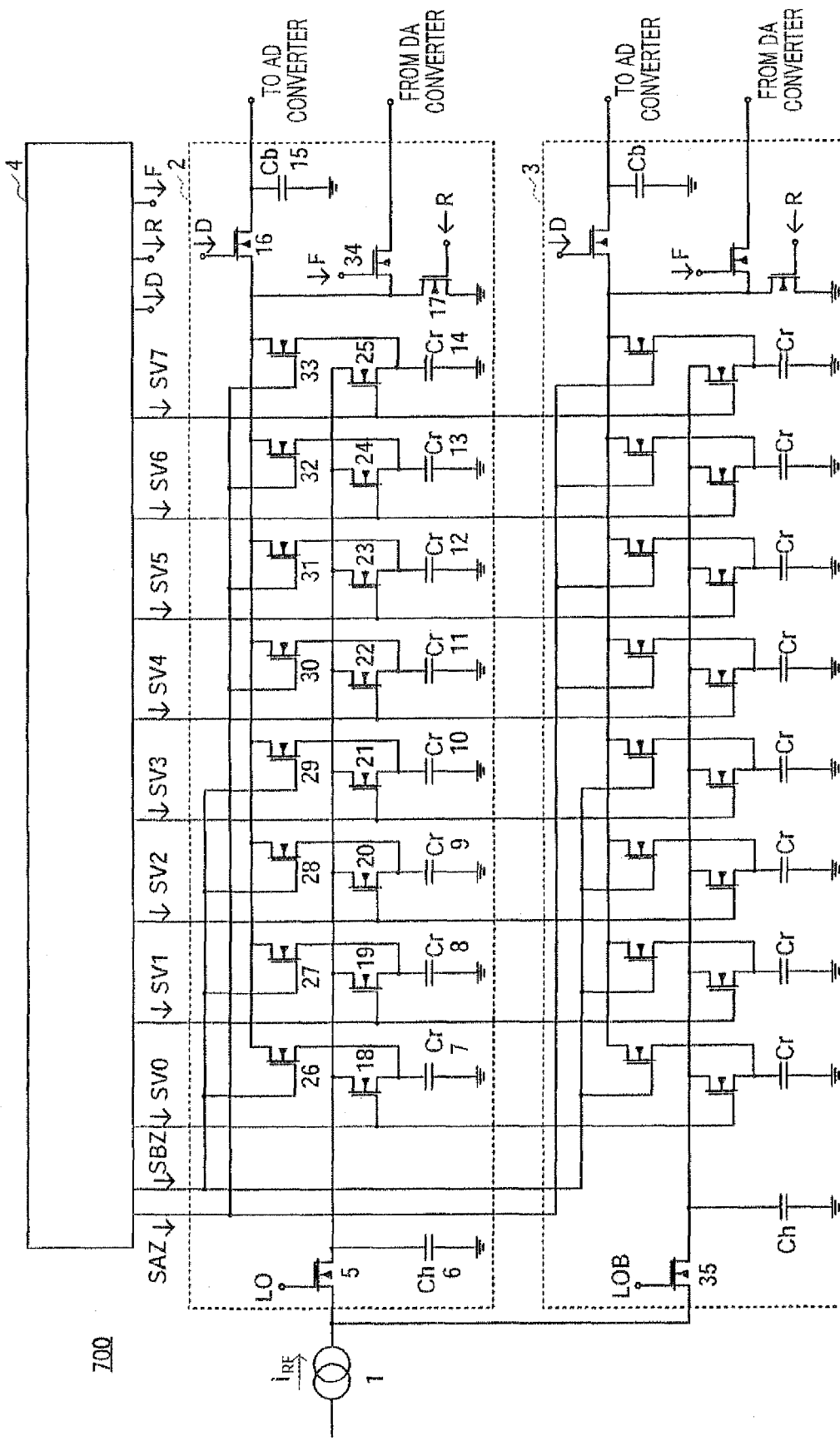
FIG. 15 is a circuit diagram of a conventional sampling mixer.
Figure 16:
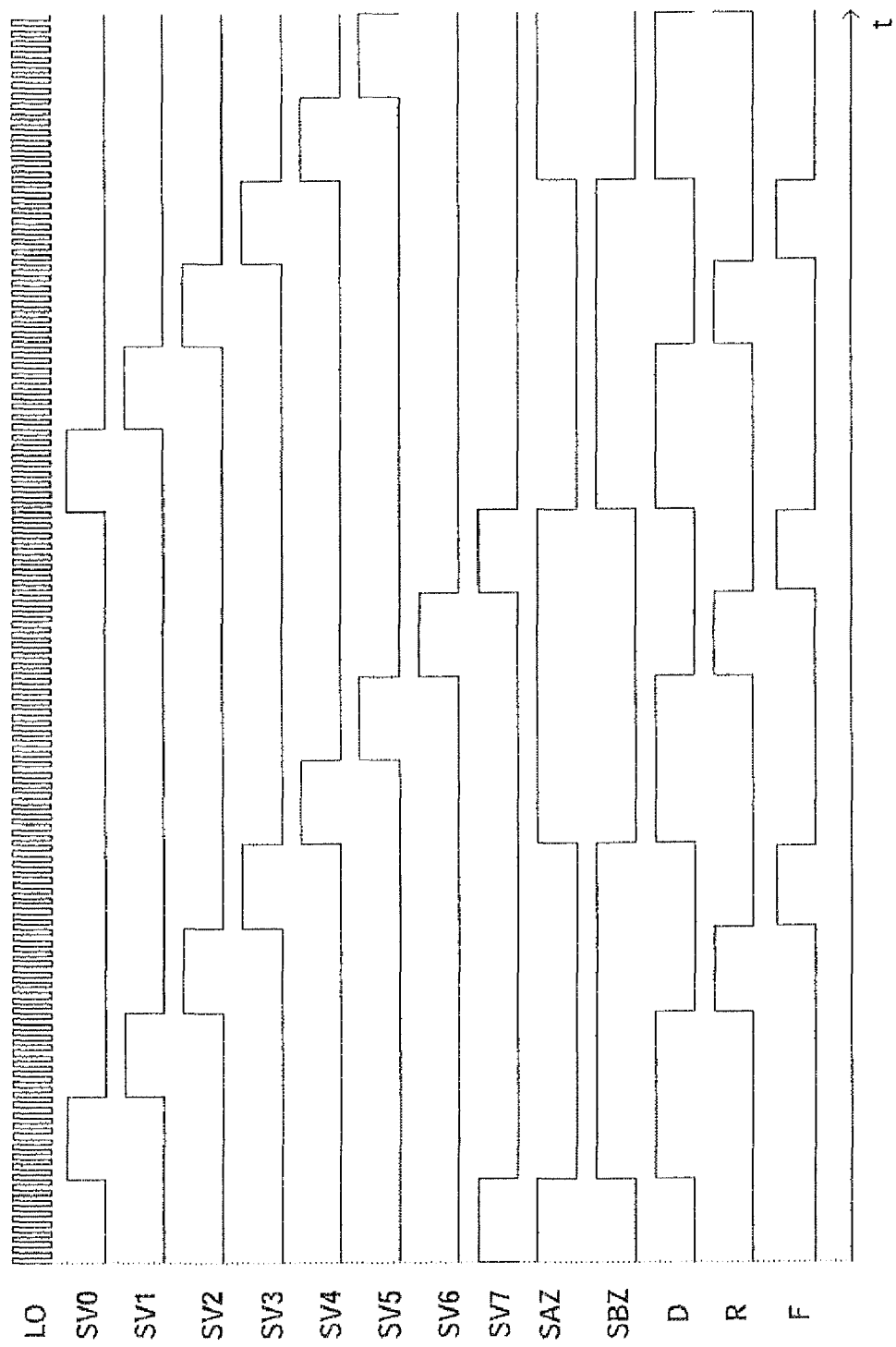
FIG. 16 is a timing chart of the control signal generated in the control signal generator of FIG. 15.

FIG. 14 is a block diagram showing a configuration example of radio apparatus 600 in Embodiment 7 of the present invention. Radio apparatus 600 refers to, for example, a mobile telephone, automobile telephone and transceiver.

In FIG. 14, radio apparatus 600 has antenna 601, duplexer 602, transmitter 603, receiver 604 and signal processor (DSP) 605.

Further, transmitter 603 has power amplifier (PA) 606 and modulator 607. Receiver 604 has low noise amplifier (LNA) 608 and sampling mixer 609. Sampling mixer 100 in Embodiment 1 of FIG. 1 is used for sampling mixer 609. By so doing, the present invention is useful because sampling mixer 100 that is able to adjust the number of notches and notch frequency can be applied. Further, one of sampling mixers in Embodiments 2, 3, 4, and 6 may be used for sampling mixer 609 (see FIG. 4, FIG. 7, FIG. 10 and FIG. 12).

Antenna 601 is connected with transmitter 603 and receiver 604 through duplexer 602.

Duplexer 602 supports each frequency band of a transmission signal and received signal. Further, when receiving as input a signal from transmitter 603, duplexer 602 makes the frequency band of the transmission signal in the signal pass, and outputs the signal to antenna 601. On the other hand, when receiving as input a signal from antenna 601, duplexer 602 makes the frequency band of the received signal in the signal pass, and outputs the signal to receiver 603.

Signal processor 605 carries out AD conversion of the output signal from receiver 603 and then carries out signal processing (for example, speech processing and data processing) of the output signal. Further, signal processor 605 carries out signal processing of a predetermined input signal (for example, speech and data), carries out DA conversion (not shown) of the signal and outputs the signal to transmitter 603. Further, although the number of signal processor 605 of FIG. 14 is one, a plurality of signal processors 605 may be used.

By configuring radio apparatus 600 this way, even if the degree of attenuation of duplexer 602 between transmitter 603 and receiver 604 is not sufficient, it is possible to remove the frequency band of a transmission signal (i.e. interfering wave) leaking to receiver 604 by adjusting the filter characteristics (see FIG. 3) of sampling mixer 609. Consequently, it is possible to reduce deterioration of reception sensitivity due to the distortion of output of sampling mixer 609. Further, the interfering waves can be removed, so that the present invention is useful because parts of filters for removing interfering waves need not to be provided in radio apparatus 600.

Further, although cases of a sampling mixer or a radio apparatus including this sampling mixer have been described with Embodiments 1 to 7, a discrete filter not including sampling switch 5 or a radio apparatus including this discrete filter may be applied.

The disclosure of Japanese Patent Application No. 2006-160280, filed on Jun. 8, 2006, including the specification, drawings and abstract, is incorporated herein by reference in its entirety.

INDUSTRIAL APPLICABILITY

The discrete time processing filter and sampling mixer according to the present invention is useful for a radio circuit of the radio apparatus. Particularly, the present invention is suitable to carry out a frequency conversion of signals.

The invention claimed is:

1. A discrete filter comprising:
   a control signal generator that generates a plurality of control signals of a same frequency and varying phases;
   a convolution capacity section that receives as input a received signal;
   a buffer capacitor that integrates a discrete signal released from the convolution capacity section, wherein:
   the convolution capacity section includes m+1 integration units including m integration elements connected in parallel (where m is a natural number of two or more);
   all of the m integration elements included in one integration unit selected from the m+1 integration units integrate the received signal at a same timing based on the control signals; and
   an integration element selected one by one from the m integration units other than the selected one integration unit, outputs a signal integrated earlier at a same timing at which the received signal is integrated.

2. The discrete filter according to claim 1, wherein:
   the m+1 integration units are connected in parallel; and the integration units including m integration elements that integrate the received signal switch to other integration units at timings based on the control signals.

3. The discrete filter according to claim 2, wherein:
each integration unit comprises:
integration switches that switch an inputted state of the received signal to the m integration units; and
m release switches connected to each integration element;
the integration switches are turned on in a cycle such that on states of the integration units do not overlap in a time domain; and
the m release switches in each integration unit are turned on in a cycle such that on states of the m release switches and on states of the integration switches provided in a same integration unit do not overlap in the time domain.

4. The discrete filter according to claim 2, further comprising:
a signal reset section that resets the received signal integrated in the integration units; and
a feedback switch that, after the received signal is reset, feeds back a feedback signal for adjusting output characteristics of the integration units, to the integration units.

5. The discrete filter according to claim 2, further comprising:
a rotate capacitor that is provided between the integration units and the buffer capacitor;
other integration switches that switch inputted states of released signals of the integration units to the rotate capacitor; and
other release switches that are connected to one end of the rotate capacitor and that switch released states of signals to the buffer capacitor integrated in the rotate capacitor.

6. The discrete filter according to claim 2, further comprising a history capacitor with one end connected to input stages of the integration units.

7. The discrete filter according to claim 2, wherein the m+1 integration units connected in parallel are arranged in series.

8. A discrete filter comprising:
a first convolution capacity section that comprises m+1 integration units which comprises m integration elements connected in parallel and integrating a received signal (where m is a natural number of two or more) and which are connected in parallel;
a second convolution capacity section that has a same configuration as the first convolution capacity section and that receives as input a received signal of a phase opposite to the received signal inputted to the first convolution capacity section; and
a first buffer capacitor and a second buffer capacitor that integrate signals released from the first convolution capacity section and the second convolution capacity section, wherein:
each integration unit of the first convolution capacity section releases the received signal integrated in the m integration elements to the second buffer capacitor at specific release timings out of m release timings associated with the m integration elements, and releases the received signal to the first buffer capacitor at release timings other than the specific release timings; and
each integration unit of the second convolution capacity section releases the received signal integrated in the m integration elements to a buffer capacitor opposite to the integration units of the first convolution capacity section at same release timings as the integration units of the applicable first convolution capacity section.

9. The discrete filter according to claim 8, wherein the specific release timings comprising an even-numbered release timing out of the m release timings.

10. A discrete filter according to claim 8, wherein:
each integration unit comprises:
integration switches that switch an inputted state of the received signal to the N integration elements; and
m release switches connected to each integration unit,
in each integration unit of the first convolution capacity section, release switches that are turned on in even-numbered turns from timings at which states of the integration switches switch, are connected to the second buffer capacitor and release switches that are turned on in odd-numbered turns, are connected to the first buffer capacitor; and
in each integration unit of the second convolution capacity section, release switches that are turned on in odd-number turns from timings at which states of the integration switches switch, are connected to the second buffer capacitor and release switches that are turned on in odd-number turns, are connected to the first buffer capacitor.

11. A sampling mixer comprising:
a discrete filter according to claim 1; and
a sampling switch that is provided at a stage prior to the discrete filter and that samples a received signal at a predetermined frequency.

12. A sampling mixer comprising:
a discrete filter according to claim 8; and
a sampling switch that is provided at a stage prior to the discrete filter and that samples a received signal at a predetermined frequency.

13. A radio apparatus comprising:
a discrete filter according to claim 1;
a signal processor that carries out signal processing based on an output signal of the discrete filter; and
a modulator that modulates the output signal after the signal processing in the signal processor.

14. A radio apparatus comprising:
a discrete filter according to claim 8;
a signal processor that carries out signal processing based on an output signal of the discrete filter; and
a modulator that modulates the output signal after the signal processing in the signal processor.

15. A radio apparatus comprising:
a sampling mixer according to claim 11;
a signal processor that carries out signal processing based on an output signal of the discrete filter; and
a modulator that modulates the output signal after the signal processing in the signal processor.

16. A radio apparatus comprising:
a sampling mixer according to claim 12;
a signal processor that carries out signal processing based on an output signal of the discrete filter; and
a modulator that modulates the output signal after the signal processing in the signal processor.

* * * * *